(12) United States Patent
Onicha et al.

(10) Patent No.: US 9,627,200 B2
(45) Date of Patent: Apr. 18, 2017

(54) SYNTHESIS OF CDSE/ZNS CORE/SHELL SEMICONDUCTOR NANOWIRES

(71) Applicant: US Nano LLC, South Bend, IN (US)

(72) Inventors: Anthony C. Onicha, Bradenton, FL (US); Louise E. Sinks, Sarasota, FL (US); Stefanie L. Weber, Sarasota, FL (US)

(73) Assignee: US Nano LLC, Sarasota, FL (US)

( * ) Notice: Subject to any disclaimer, the term of this patent is extended or adjusted under 35 U.S.C. 154(b) by 39 days.

(21) Appl. No.: 14/446,313

(22) Filed: Jul. 29, 2014

(65) Prior Publication Data
US 2015/0028288 A1 Jan. 29, 2015

Related U.S. Application Data

(60) Provisional application No. 61/859,429, filed on Jul. 29, 2013.

(51) Int. Cl.
*H01L 33/00* (2010.01)
*H01L 21/02* (2006.01)

(52) U.S. Cl.
CPC .... *H01L 21/02603* (2013.01); *H01L 21/0256* (2013.01); *H01L 21/02477* (2013.01); *H01L 21/02513* (2013.01); *H01L 21/02557* (2013.01); *H01L 21/02628* (2013.01)

(58) Field of Classification Search
CPC ............ H01L 33/0029; H01L 29/0669; H01L 31/035227; H01L 21/02603; G02F 2001/01783; G02F 2202/106; G02F 2202/107
See application file for complete search history.

(56) References Cited

U.S. PATENT DOCUMENTS

| | | | |
|---|---|---|---|
| 8,259,772 B2 | 9/2012 | Krahne et al. | |
| 8,294,267 B2 | 10/2012 | Banin et al. | |
| 8,354,785 B2 | 1/2013 | Clough et al. | |
| 2006/0019427 A1* | 1/2006 | Cao ................................ | 438/95 |
| 2006/0273328 A1 | 12/2006 | Niu et al. | |
| 2007/0186846 A1* | 8/2007 | Yong et al. .................... | 117/41 |
| 2011/0253032 A1 | 10/2011 | Jeong et al. | |
| 2011/0268968 A1 | 11/2011 | Mokari et al. | |
| 2011/0272668 A1 | 11/2011 | Taylor et al. | |

(Continued)

FOREIGN PATENT DOCUMENTS

| | | |
|---|---|---|
| WO | 2010040100 A2 | 4/2010 |
| WO | 2010051405 A1 | 5/2010 |

OTHER PUBLICATIONS

Mokari et al Chem Mater. 2003 vol. 15 pp. 3955-3960 "Synthesis . . . nanorods".*

(Continued)

*Primary Examiner* — Jerome Jackson, Jr.
(74) *Attorney, Agent, or Firm* — Husch Blackwell LLP

(57) ABSTRACT

The present disclosure provides systems, processes, articles of manufacture, and compositions that relate to core/shell semiconductor nanowires. Specifically, the disclosure provides a novel semiconductor material, CdSe/ZnS core/shell nanowires, as well as a method of preparation thereof. The disclosure also provides a new continuous flow method of preparing core/shell nanowires, including CdSe/CdS core/shell nanowire and CdSe/ZnS core/shell nanowires.

25 Claims, 11 Drawing Sheets

(56) References Cited

U.S. PATENT DOCUMENTS

| | | | |
|---|---|---|---|
| 2012/0061627 A1* | 3/2012 | Reiss et al. | 252/519.14 |
| 2013/0206232 A1* | 8/2013 | Korgel et al. | 136/262 |
| 2014/0326921 A1* | 11/2014 | Lu et al. | 252/301.6 S |

OTHER PUBLICATIONS

Cozzoli et al. Synthesis, Properties and Perspective of Hybrid Nanoncrystal Structures. Chemical Society Reviews, 35:1195-1208, 2006. Entire document.

Grebinkski et al. Solution-Based Straight and Branched CdSe Nanowires. Chem. Mater. 16 (25); 5260-5272, 2004. Entire document.

Goebl et al. Solution-based II-VI core/shell nanowire heterostructures, J Am Chem Soc 2008;130:14822-33 Entire document.

Wang et al. Highly Luminescent CdSe/ZnS Nanocrystals Synthesized Using a Single-Molecular ZnS Source in a Microfluidic Reactor. Adv Funct Mater 2005;15:603-8.

Yang et al. Continuous Synthesis of Full-Color Emitting Core/Shell Quantum Dots via Microreaction. Cryst Growth Des 2009;9:4807-13. Entire document.

Cao et al. Synthesis and characterization of InAs/InP and InAs/CdSe core/shell nanocrystals. Angew Chemie—Int Ed 1999;38:3692-4. Entire document.

Fukata et al. Characterization of impurity doping and stress in Si/Ge and Ge/Si core-shell nanowires. ACS Nano 2012;6:8887-95. Entire document.

Hu et al. Hole spin relaxation in Ge—Si core-shell nanowire qubits. Nat Nanotechnol 2011;7:47-50. Entire document.

Mokari et al. Synthesis and Properties of CdSe / ZnS Core / Shell Nanorods. Chem Mater 2003;15:3955-60. Entire document.

Li et al. Synthesis and Characterization of Colloidal Core-Shell Semiconductor Nanowires. Eur J Inorg Chem 2010;2010:4325-31. Entire document.

Fan et al. Three-dimensional nanopillar-array photovoltaics on low-cost and flexible substrates. Nat Mater 2009;8:648-53. Entire document.

Tang et al. Solution-processed core-shell nanowires for efficient photovoltaic cells. Nat Nanotechnol 2011;6:588-72. Entire document.

Tian et al. Coaxial silicon nanowires as solar cells and nanoelectronic power sources. Nature 2007;449:885-9. Entire document.

Tak et al. Fabrication of ZnO/CdS core/shell nanowire arrays for efficient solar energy conversion. J Mater Chem 2009;19:5945. Entire document.

Singh et al. Synthesis of In2O3—ZnO core-shell nanowires and their application in gas sensing. Sensors Actuators B Chem 2011;160:1346-51. Entire document.

Li et al. Au@Pd core-shell nanoparticles. A highly active electrocatalyst for amperometric gaseous ethanol sensors. Sensors Actuators B Chem 2012;171-172:1192-8. Enitre document.

Du et al. Low-temperature chemical solution route for ZnO based sulfide coaxial nanocables: general synthesis and gas sensor application. Nanotechnology 2007;18:115619. Entire document.

Kazes et al. Lasing from Semiconductor Quantum Rods in a Cylindrical Microcavity 2002;90:317-21. Entire document.

Yin et al. Enhanced solar water-splitting efficiency using core/sheath heterostructure CdS/TiO2 nantube arrays. Nanotechnology 2007;18:495608. Entire document.

Malik et al. A Simple Route to the Synthesis of Core/Shell Nanoparticles of Chalcogenides. Chem Mater 2002;14:2004-10. Entire document.

Wan et al. Size Controlled Synthesis of Blue Emitting Core / Shell Nanocrystals via Microreaction. J Phys Chem C 2011;115:1569-75. Entire document.

Dabbousi et al. ( CdSe ) ZnS Core-Shell Quantum Dots.: Synthesis and Characterization of a Size Series of Highly Luminescent Nanocrystallites. J Phys Chem B 1997;101:9463-75. Entire document.

Thibert et al. Sequestering High-Energy Electrons to Facilitate Photocatalytic Hydrogen Generation in CdSe/CdS Nanocrystals. J Phys Chem Lett 2011;2:2688-94. Entire document.

Petchsang et al. Low temperature solution-phase growth of ZnSe and ZnSe/CdSe core/shell nanowires. Nanoscale 2011;3:3145-51. Entire document.

Liu et al. Bright core-shell semiconductor quantum wires. J Am Chem Soc 2012;134:18797-803. Entire document.

Mokari et al. Synthesis of Lead Chalcogenide Alloy and Core-Shell Nanowires. Angew Chemie Int Ed 2008;47:5605-8. Entire document.

Tongying et al. Photocatalytic Hydrogen Generation Efficiencies in One-Dimensional CdSe Heterostructures. J Phys Chem Lett 2012;3:3234-40. Entire document.

Zhuang et al. Composition and bandgap-graded semiconductor alloy nanowires. Adv Mater 2012;24:13-33. Entire document.

Li et al. Controlled Synthesis of CdSe Nanowires by Solution-Liquid-Solid Method. Adv Funct Mater 2009;19:3650-61. Entire document.

Wang et al. Solution-liquid-solid growth of semiconductor nanowires. Inorg Chem 2006;45:7511-21. Entire document.

Kuno M. An overview of solution-based semiconductor nanowires: synthesis and optical studies. Phys Chem Chem Phys 2008:10:620. Entire document.

Zhuang et al. Controlled synthesis of semiconductor nanostructures in the liquid phase. Chem Soc Rev 2011;40:5492. Entire document.

Li et al. Large-scale synthesis of nearly monodisperse CdSe/CdS core/shell nanocrystals using air-stable reagents via successive ion layer adsorption and reaction. J Am Chem Soc 2003;125:12567-75. Entire document.

Talapin et al. Highly Luminescent Monodisperse CdSe and CdSe/ZnS Nanocrystals Synthesized in a Hexadecylamine-Trioctylphosphine Oxide- Trioctylphospine Mixture. Nano Lett 2011;1:207-11. Entire document.

Murray et al. Synthesis and characterization of nearly monodisperse CdE (E—S, Se, Te) semiconductor nanocrystaliites. J Am Chem Soc 1993;115:8706-15. Entire document.

Pradhan et al. Synthesis of High-Quality Metal Sulfide Nanoparticles from Alkyl Xanthate Single Precursors in Alkylamine Solvents. J Phys Chem B 2003;107:13843-54. Entire document.

Aldana et al. Photochemical instability of CdSe nanocrystals coated by hydrophilic thiols. J Am Chem Soc 2001;123:8844-50. Entire document.

Lim et al. Anisotropic Etching of Semiconductor Nanocrystals. Chem Mater 2011;23:5029-36. Entire document.

Li et al. Amine-assisted facetted etching of CdSe nanocrystals. J Am Chem Soc 2005;127:2524-32. Entire document.

Wang et al. Spectroscopic Identification of Tri- n -octylphosphine Oxide (TOPO) Impurities and Elucidation of Their Roles in Cadmium Selenide Quantum-Wire Growth. J Am Chem Soc 2009;131:4983-94. Entire document.

Bullen et al. High Activity Phosphine-Free Selenium Precursor Solution for Semiconductor Nanocrystal Growth. Chem Mater 2010;22:4135-43. Entire document.

Lamer et al., Theory, Production and Mechanism of Formation of Monodispersed Hydrosols, Journal of The American Chemical Society, vol. 72, No. 11, Nov. 17, 1950.

Yang et al., High Temperature Synthesis of CdSe Nanocrystals in a Serpentine Microchannel: Wide Size Tunability Achieved under a Short Residence Time, Crys. Growth Des. 2009, 9:1569-74.

Life Technologies, Qdot® Nanocrystal Technology Overview. QDot Technol Overv Thermo-Fisher Scientific 2015.

* cited by examiner

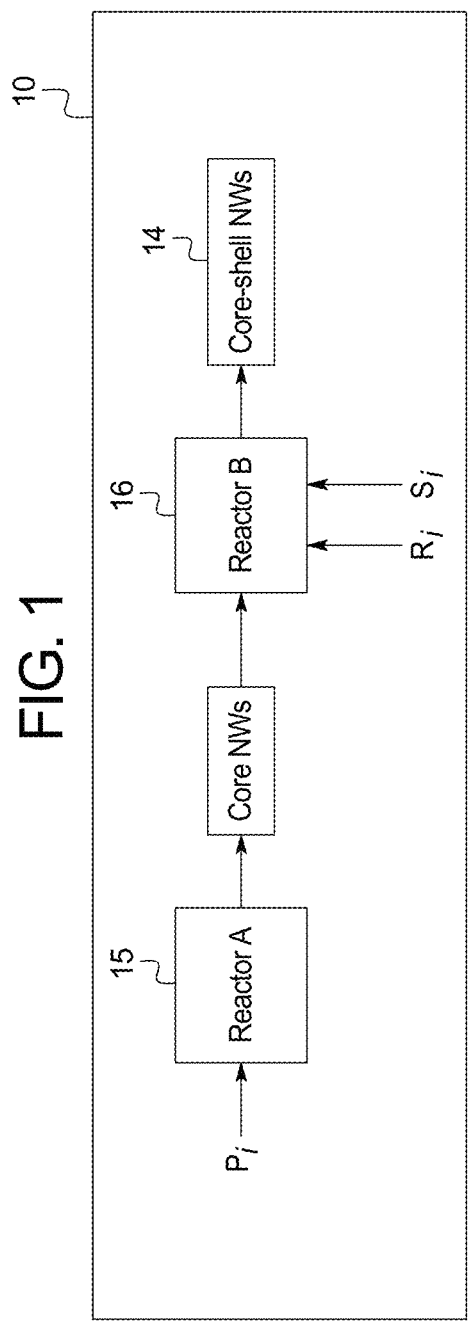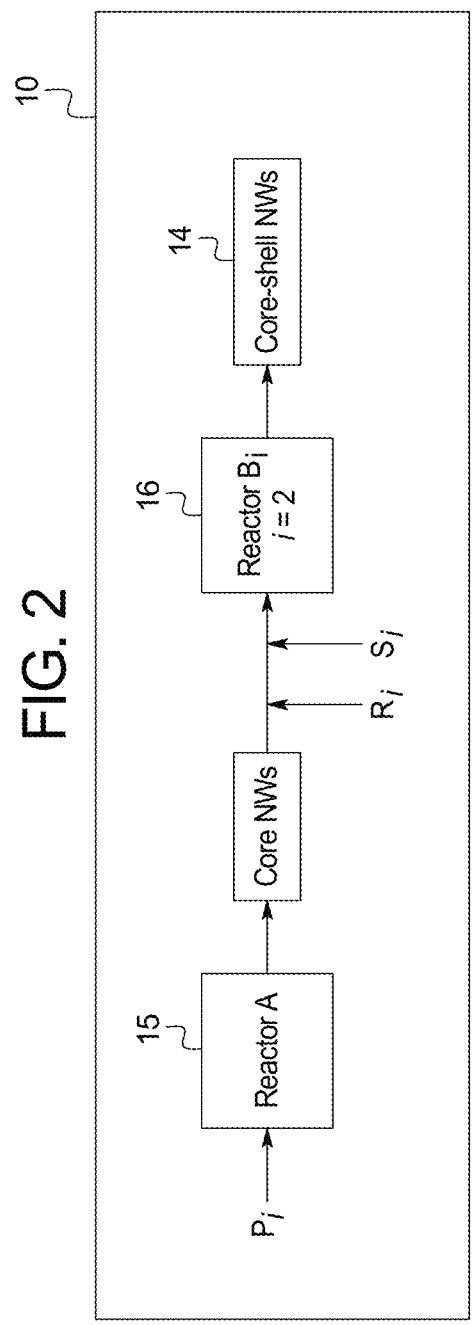

SYNTHESIS OF CDSE/ZNS CORE/SHELL SEMICONDUCTOR NANOWIRES

CROSS-REFERENCE TO RELATED APPLICATIONS

This application incorporates by reference and claims priority to U.S. Provisional Application 61/859,429 filed on Jul. 29, 2013.

GOVERNMENT RIGHTS

This invention was made with U.S. Government support under SBIR Phase IB Grant No. IIP-1214077 awarded by the National Science Foundation. The U.S. Government has certain rights in the invention.

BACKGROUND OF THE INVENTION

The present technology relates to core/shell nanowires, specifically, a cadmium-selenide core and a zinc-sulfide shell. The present technology also relates to batch methods and continuous flow methods of making core/shell nanowires.

Nanoscale materials, such as nanoparticles and nanowires, are the subject of considerable research in materials science. Part of the interest stems from the fact that materials formed with a nanometer scale dimension frequently exhibit properties that are dramatically different from the corresponding bulk materials, including unique optical, electronic, and mechanical properties. Nanowires may be used in a wide variety of applications such as various integrated circuits, chemical and biological sensors, optoelectronic devices, and photovoltaics. For example, there is an interest in developing semiconductor nanowire-based devices for use in various electronic devices and systems to replace or supplement complementary metal-oxide-semiconductor (CMOS) technologies. As another example, nanowires have a large surface area, and thus may be advantageously applied to various sensing modalities and configured as particular sensors, e.g., for biological analytes and other analytes. High surface area also is beneficial for catalysis and photocatalysis.

Of particular interest are core/shell nanowires, such as CdSe nanowires (core) coated with a wide bandgap semiconductor (shell). Both the core and the shell compositions for nanomaterials (nanocrystals, nanorods, and nanowires) are generally type II-VI, IV-VI, and III-V compound semiconductors (CdS/ZnS, CdSe/ZnS, CdSe/CdS, CdS/CdSe, and InAs/CdSe for example) [1-4] and elemental semiconductors such as group IV (Si/Ge, and Ge/Si for example). [5,6] Core/shell semiconductors nanomaterials can be classified as either Type I or Type II, based on the relative positions of the conduction and valence bands of the core and shell materials. In Type I, the conduction and valence band edges of the core lie within the bandgap of the shell. In Type II, both the conduction and valence band edges of the core are either higher or lower than the band edges of the shell. These shells have been shown to eliminate surface defects and improve photo- and air-stability of quantum dots and nanorods. [7-9]

Core/shell quantum dots and nanorods are studied for a wide variety of applications, including photovoltaics, [10-13] chemical sensors, [14-16] lasing, [17] and photocatalytic water splitting. [18] CdSe/ZnS core shell quantum dots have been widely explored, [2,19-21] and there have also been a few reports on CdSe/ZnSnanorods. [8,17] These nanorods show enhanced lasing compared to quantum dots, and have potential for other photonic applications such as LEDs. [17]

It is interesting to note that the development of core/shell quantum dots was critical for the successful commercialization of quantum dot based fluorescent tags. [7] The stabilizing influence of a ZnS shell to a CdSe quantum dot leads to a more emissive and more water stable nanoparticle. These features have made CdSe/ZnS quantum dots popular for biological applications such as cellular imaging. [7] In addition to the improved photo- and air-stability, CdSe/ZnS quantum dots are more robust in aqueous environments and have an enhanced quantum yield of fluorescence. [2,7,21]

Materials with type I heterojunctions have been shown to have substantial photocatalytic activity, [22] which is most likely to arise from passivation of defect states (which trap electrons) of the core material by the wide band gap shell (which also is what leads to enhanced emission). This, in addition to rapid tunneling of electrons from the core through the thin shell, allows the electrons to access the solvent, and perform photocatalysis. [22] CdSe/CdS materials have attracted wide-spread interest for their photocatalytic properties, and particularly for their ability to generate hydrogen from water. [22]

While numerous methods for coating quantum dots (QD) with other semiconductors can be found in the literature, there are few examples of coating nanowires (NWs) [1,9, 23-27] or nanorods (NRs). [8] The few reports of core/shell nanowires have described tedious optimizations of many reaction parameters. Extremely good results have been obtained for QD core/shell production via microreactor. [2,3,20] However, application of these procedures and processes to coat nanowires has not been successful.

Semiconductor nanowires may be synthesized using a range of conditions, from high temperature (e.g., less than 1100° C.) gas-phase reactions, [28] to relatively low temperature (e.g., less than 250° C.) solution-phase conditions. Solution-phase routes to semiconductor nanowires are of particular interest due to the potential for size and shape control, chemical surface passivation, colloidal dispersibility, and adaptability to high throughput continuous processes. Solution methods allow greater control over structure and function than gas phase methods. [29]

Solution-phase routes to semiconductor nanowires include non-catalyzed (e.g., oriented attachment, and solvo-thermal/hydrothermal growth), and catalyzed (e.g., super-critical-fluid-liquid-solid growth, and solution-liquid-solid growth) approaches. The most reliable, reproducible, and general method has proved to be the catalyzed method, and consequently this method has been widely adopted. [30] In the catalyzed approach, small metal droplets are used to induce the asymmetric crystallization of semiconductors from precursors in solution. [31] The metal droplets are interchangeably called the metal seeds, the metal seed particles, or the catalyst. Among the catalyzed solution-phase routes, solution-liquid-solid approach affords the use of lower temperatures (e.g., less than 250° C.) to grow semiconductor nanowires with such advantages as nanowire crystallinity, length, and diameter control. [30] The solution-liquid-solid (SLS) is so named based on a proposed mechanism wherein the nanomaterials precursors are in solution, then partition in to the liquid catalyst, and lastly the solid nanowire is grown.

Common among the solution-phase routes to many nanomaterials is a hot-injection technique in which a precursor solution at room temperature is injected into a second precursor solution held at a certain elevated temperature in order to rapidly produce a large amount of monomers to trigger a burst of nucleation and subsequent growth of nanomaterials in a controlled manner in the reaction system. [32] The solution-phase routes are typically performed as a small scale batch process to achieve the required control over thermal and mass transport properties needed to control nucleation and growth.

Despite the fact that quantum dots and nanowires can both be made by the hot-injection batch method, and many examples of core/shell quantum dot solution syntheses have been published, there has been little success in adapting those procedures to produce core/shell nanowires. Solution-phase methods for producing core/shell nanowires are difficult to implement, as many of the chemicals used in the core synthesis impede addition of the shell semiconductor. The Kuno group found that the presence of trioctylphosphine oxide (TOPO) or other coordinating solvents strongly impeded the coating process, [1] and thus necessitated washing and ligand exchange to remove excess TOPO from the nanowires. However, washing can lead to bundling, the phenomenon where nanowires stick together, and there is evidence that the bundling of nanoparticles induced by washing impedes the coating process. [33] In contrast, no washing step is required for core/shell quantum dot [2,3] or quantum rod [8] synthesis.

Additionally, the reaction conditions used to add the shell material frequently can damage the core nanowires. For example, nanowires and nanorods are often found to be etched to smaller dimensions under some reaction conditions used to coat quantum dots. [8,9] Lastly, the chemicals used to create materials of high interest, such as CdSe/CdS core/shell nanowires, are frequently extremely dangerous, such as the highly reactive dimethyl cadmium. Dimethyl cadmium has been successfully used to produce CdSe/CdS core shell nanowires [1], but its strongly pyrophoric nature necessitates the use of a glovebox and air-free conditions.

Other core/shell nanomaterial compositions of high interest include CdSe/ZnS. However, CdSe nanowires have yet to be coated with a zinc sulfide shell. Previous attempts by Li et al. at producing CdSe/ZnS nanowires using zinc hexadecyl xanthate were unsuccessful, and resulted in ZnS nanorods not attached to the CdSe parent nanowires. [9] The difficulty in synthesizing CdSe/ZnS nanowire heterostructures was attributed to the large lattice mismatch between CdSe and ZnS (12%), therefore making it much more complicated to produce than the quantum dot counterpart.[9]

As a result, there is a need for a coated nanowire material, specifically CdSe/ZnS nanowires, and method of making thereof that may be manufactured on a large scale, that provides reproducible products among various batches, and that generates nanowires that exhibit advantageous semiconducting properties. The method should be robust, and easily adaptable to other compositions, such as CdSe/CdS core/shell nanowires.

Additionally, there is a need for the ability to tune the morphology of the core/shell material for different applications. For example, a smooth shell is advantageous for applications that require higher luminescence yield. Conversely, a rougher higher surface area coating is advantageous for catalytic and sensing applications.

BRIEF SUMMARY OF THE INVENTION

The present disclosure provides systems, processes, articles of manufacture, and compositions that relate to core/shell semiconductor nanowires. Specifically, the disclosure provides a novel semiconductor material, CdSe/ZnS core/shell nanowires, as well as a method of preparation thereof. The disclosure also provides a new continuous flow method of preparing core/shell nanowires, including CdSe/CdS core/shell nanowires and CdSe/ZnS core/shell nanowires. These methods of preparation may be applied to other nanowires compositions.

The present disclosure provides a method of manufacturing core/shell nanowires by first growing parent nanowires according to Solution Liquid Solid (SLS) techniques, followed by a second step in which a coating is overgrown at lower temperatures. For example, the CdSe/ZnS product takes on the morphology of the core CdSe, which may be straight and/or branched nanowires. The present methods for CdSe/ZnS nanowire synthesis may include a batch reaction that may be performed in a round bottom flask, for example, or a continuous flow reaction that uses a microfluidic reactor. The continuous flow reaction method may be further broken down into a partial flow reaction or a full flow reaction (also referred to as "in-line" reaction). For example, the CdSe nanowires may be produced in a first flow reactor, and the subsequent coating of the CdSe nanowires with ZnS may also be performed in a second flow reactor.

The methods disclosed herein may also control the morphology of the shell, by adjusting coating conditions. Changes in the coating residence time, reactor configuration (batch vs. continuous flow), the shell precursor reactivity, and the shell annealing temperature may each contribute to the final morphology. For example, analogous experiments with CdSe/CdS NWs may shed a light on how coating conditions affect the final coating properties. When using the more reactive cadmium ethyl xanthate as the CdS shell precursor, the coating is very rough and spiky compared to those produced with the milder cadmium hexadecyl xanthate. The overcoating annealing temperature is also dependent on the shell precursor materials. For example cadmium ethyl xanthate requires relatively low temperatures (90° C.), while cadmium hexadecyl xanthate requires higher temperatures (130° C.) since it is less reactive.

Core/shell nanowires produced according to the continuous flow reactor method disclosed herein have a smoother annealed shell coating, and a more uniform coating compared to those prepared under batch conditions. However, flow processes may also require higher temperatures than batch processes. In one case, the batch process successfully coated wires at 90° C., whereas the same reaction under flow conditions did not produce coated wires until the temperature was increased to 130° C.

In an embodiment, the coated nanowire includes a nanowire body comprising a cadmium semiconductive material, wherein the nanowire body includes an outer surface. The coated nanowire also includes a semiconductor coating on at least a portion of the outer surface of the nanowire body, wherein the semiconductor coating includes zinc. In an example, the nanowire body includes a cadmium selenide semiconductive material.

In an example, the semiconductor coating includes sulfur. The coated nanowires may have an average length between, and including, 1 μm to 40 μm. The coated nanowires may have an average diameter between, and including, 1 nm to 70 nm.

The nanowire body may include a cadmium selenide semiconductive material. For example, the nanowire body may include CdSe and the semiconductor coating includes ZnS.

In an embodiment, the continuous flow method of manufacturing coated nanowires includes providing a nanowire solution including a plurality of nanowires, and combining the nanowire solution and a shell precursor solution in a second continuous flow reactor to form a combined solution. The second continuous flow reactor is maintained at a temperature between, and including, 90° C. to 250° C. The method also includes annealing the shell precursor solution to an outer surface of the nanowires to form coated nanowires.

The method may further include combining a metal precursor solution and a chalcogenide precursor solution in a first continuous flow reactor to create the plurality of nanowires, wherein the first continuous flow reactor is maintained at a temperature between, and including, 170° C. to 300° C., wherein the first continuous flow reactor is in communication with the second continuous flow reactor.

The shell precursor solution may include zinc diethyldithiocarbamate and octadecene. The shell precursor solution may alternatively include a cadmium alkyl xanthate. The metal precursor may include cadmium oxide. In an example, at least one of the metal precursor solution and the chalcogenide precursor solution include a catalyst precursor solution, wherein the catalyst precursor solution includes a bismuth compound, such as bismuth(III) chloride and 1-methyl-2-pyrrolidinone.

In an example, the continuous flow method of producing nanowires includes combining a cadmium precursor solution, a selenium precursor solution, and a catalyst solution in a first continuous flow reactor to create a plurality of CdSe nanowires, wherein the cadmium precursor solution includes at least one of cadmium oxide, oleic acid, trioctylphosphine oxide, 1-octadecene, and diphenyl ether. The selenium precursor solution may include selenium-octadecene. The catalyst solution may include bismuth. Further, the first reactor is maintained at a temperature between, and including, 170° C. to 300° C. The method includes combining the plurality of nanowires and a shell precursor solution to form a combined solution in a second continuous flow reactor, wherein the first continuous flow reactor is in communication with the second continuous flow reactor, wherein the second continuous flow reactor is maintained at a temperature between, and including, 90° C. to 250° C. The method further includes annealing the shell precursor solution to the nanowires in the second continuous flow reactor to form a plurality of ZnS coated CdSe nanowires.

In an example, the shell precursor solution is annealed between, and including, 10 minutes to 24 hours. The shell precursor solution may include at least one of diphenyl ether, and octadecene. For example, the shell precursor solution may include at least one of octadecene, diphenyl ether, and trioctylphosphine. The shell precursor solution may include zinc diethyl dithiocarbamate (ZDC). Alternatively, the shell precursor solution may include a cadmium alkyl xanthate. For example, the shell precursor solution may include a cadmium alkyl xanthate and at least one of octadecene, diphenyl ether, dimethyl formamide, or trioctylphosphine.

The method of using the crude nanoparticle mixture for coating has been validated for QD [2,3] and nanorod [8] coating, but not nanowire synthesis. There is evidence that the bundling of nanoparticles induced by washing impedes the coating process. [33] In contrast, the present method may avoid the traditional purification process, which typically involves repeatedly washing the core nanowires in toluene with methanol added as necessary to precipitate the wires. In certain cases, the washing step is reduced to a single spin in a centrifuge to separate the nanowires from the growth solution. In other cases, the crude nanowires solution from the output of the core nanowire Reactor A may be mixed directly with additional reagents and shell precursor materials in the coating Reactor B.

An advantage of the present method is producing a novel nanowire by series reactions in continuous flow reactors where the core/shell nanowires are produced in a continuous flow reactor that is downstream from the core nanowire reactor, thereby producing core/shell nanowires that may be synthesized on a larger scale in reproducible, consistent batches.

Another advantage of the present method is using mild coating conditions to produce the core/shell nanowires. Nanowires and nanorods are often found to be etched to smaller dimensions under conventional reaction conditions used to coat quantum dots. [8,9] For example, Goebl and coworkers found that CdSe nanowires heated in ODE for 90 minutes at 290° C. were unchanged [1] while Li et al. found wires under similar conditions (ODE, 90 minutes, >200° C.) were degraded [9]. Goebl et al. reported that the nanowires underwent a ligand exchange process where the strongly coordinating TOPO ligand was replaced by the weakly coordinating pyridine ligand, while Li et al. reported that the nanowires were used with a strongly coordinating HDA ligand. The present methods disclosed herein avoid the time-consuming ligand exchange process and uses milder conditions.

Additional objects, advantages and novel features of the examples will be set forth in part in the description which follows, and in part will become apparent to those skilled in the art upon examination of the following description and the accompanying drawings or may be learned by production or operation of the examples. The objects and advantages of the concepts may be realized and attained by means of the methodologies, instrumentalities and combinations particularly pointed out in the appended claims.

BRIEF DESCRIPTION OF THE DRAWINGS

The drawing figures depict one or more implementations in accord with the present concepts, by way of example only, not by way of limitations. In the figures, like reference numerals refer to the same or similar elements.

FIG. 1 is a schematic of a reactor configuration and method for CdSe/ZnS core/shell nanowire production according to traditional batch hot injection methods presented in Example 1 disclosed herein.

FIG. 2 is a schematic of a reactor configuration and method for CdSe/ZnS core/shell nanowire production using a flow reaction according to Example 2 disclosed herein, wherein core nanowire precursors, $P_i$, are introduced to a first reactor to produce core CdSe nanowires, wherein the core nanowires are combined with additional reagents, $R_i$, to form a core nanowires suspension, wherein the core nanowires suspension is combined with ZnS shell precursor materials, $S_i$, wherein the mixture of core nanowires suspension and shell precursor materials flows through a series of coating reactors to produce CdSe/ZnS core/shell nanowires.

FIG. 4 is a Transmission Electron Microscopy (TEM) image taken of core CdSe nanowires prior to overcoating with a shell.

FIG. 7a is a TEM of the nanowires after coating core nanowires to produce CdSe/ZnS core/shell nanowires. FIG. 7b graphically depicts the results of energy-dispersive X-ray spectroscopy (EDX) of CdSe/ZnS nanowires. FIG. 7c graphically depicts the UV-Vis absorption spectrum of CdSe/ZnS nanowires.

FIG. 11b graphically depicts the results of energy-dispersive X-ray spectroscopy (EDX) of CdSe/CdS nanowires produced in FIG. 11a.

FIG. 12b is an EDX of the resulting nanowires shown in FIG. 13a.

FIG. 14b is an EDX of the nanowires shown in FIG. 14a.

DETAILED DESCRIPTION OF THE INVENTION

Figure 3:
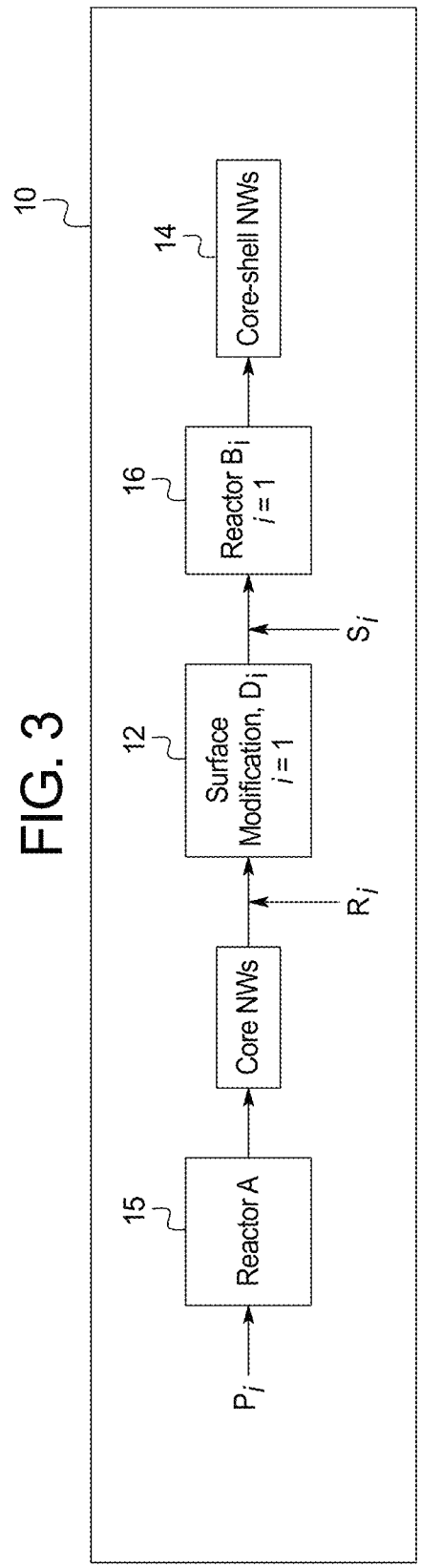
FIG. 3 is a schematic of a reactor configuration and method for CdSe/CdS core/shell nanowire production according to Example 3 disclosed herein, wherein core nanowire precursors, $P_i$, are introduced to a first reactor to produce core CdSe nanowires, wherein the core nanowires are combined with additional reagents, $R_i$, to form a core nanowires suspension, wherein the core nanowires suspension proceeds through a surface modification unit, wherein the modified core nanowires suspension is combined with CdS shell precursor materials, $S_i$, wherein the mixture of core nanowires suspension and shell precursor materials flows through a coating reactor to produce CdSe/CdS core/shell nanowires.

The following description of technology is merely exemplary in nature of the subject matter, manufacture and use of one or more inventions, and is not intended to limit the scope, application, or uses of any specific invention claimed in this application or in such other applications as may be filed claiming priority to this application, or patents issuing therefrom. Regarding the methods disclosed, the order of the steps presented is exemplary in nature, and thus, the order of the steps may be different in various embodiments. Except in the examples, or where otherwise expressly indicated, all numerical quantities in this description indicating amounts of material or conditions of reaction and/or use are to be understood as modified by the word "about" in describing the broadest scope of the technology.

The present technology relates to various combinations of core/shell nanomaterials and methods of making such core/shell nanomaterials, particularly, CdSe/ZnS nanowires. Coating CdSe nanowires with a ZnS shell may improve quantum yield and fluorescence properties of the nanowires as compared to nanowires formed of the CdSe core alone. Additionally, coated materials are likely to be more stable to damage from water and oxygen, which is a key feature required to produce stable devices based on nanowires. Prototype photosensors based on uncoated CdSe nanowires only functioned for 8 months when exposed to ambient laboratory conditions.

The present nanowires may have lengths greater than or equal to 1 µm, where certain embodiments of nanowires may have lengths of greater than or equal to 40 µm. The present nanowires may have average lengths of at least 1 µm, at least 5 µm, at least 10 µm, at least 20 µm, at least 30 µm, at least 40 µm, or at least 50 µm. Alternatively, or in addition to, the average length may be less than 100 µm, less than 90 µm, less than 80 µm, less than 70 µm, less than 60 µm, or less than 50 µm. The average length may be defined by any two of the above endpoints. For example, the average length may be between, and including, 1 µm to 50 µm, 5 µm to 20 µm, 10 µm to 50 µm, or 40 µm to 100 µm. The nanowires may also have unconstrained lengths.

The disclosed nanowires may have an average diameter on the order of a nanometer ($10^{-9}$ m), and in some embodiments, the thickness or diameter may be several nanometers or even tens of nanometers. For example, the present nanowires may have an average diameter of at least 1 nm, at least 5 nm, at least 10 nm, at least 20 nm, or at least 30 nm. Alternatively, or in addition to, the nanowires may have an average diameter of less than 100 nm, less than 50 nm, less than 30 nm, less than 10 nm, or less than 5 nm. The average diameter may be defined by any two of the above endpoints. For example, the average diameter may be between, and including, 1 nm to 40 nm, 5 nm to 10 nm, 10 nm to 50 nm, or 5 nm to 30 nm.

The nanowires may exhibit aspect ratios (length-to-width ratios) of 10:1, 100:1, to 1000:1 or more. As such, the nanowires are sometimes referred to as one-dimensional (1-D) materials. These aspect ratios apply to both the core and core/shell nanowires, as well as to wires produced in flow and batch processes. CdSe wires from both flow and batch processes result in the same aspect ratios listed above, though the flow reactor generally has better control over the size dispersity and gives tighter diameter distributions, due to better heat and mass transfer. The core and the core/shell wires maintain similar aspect ratios, since the length is still on the scale of microns and the shell coating increases the diameter by some nanometers.

The shell coating may have a uniform thickness or may vary along the length of the nanowire, and may be a single monolayer or a plurality of layers. Shell thickness may be tuned by varying parameters such as the amount of shell precursor and the overcoating residence time. From the CdSe/ZnS NWs produced in the examples provided here, the shell thickness ranged from 1 nm to 4 nm.

Figure 4:
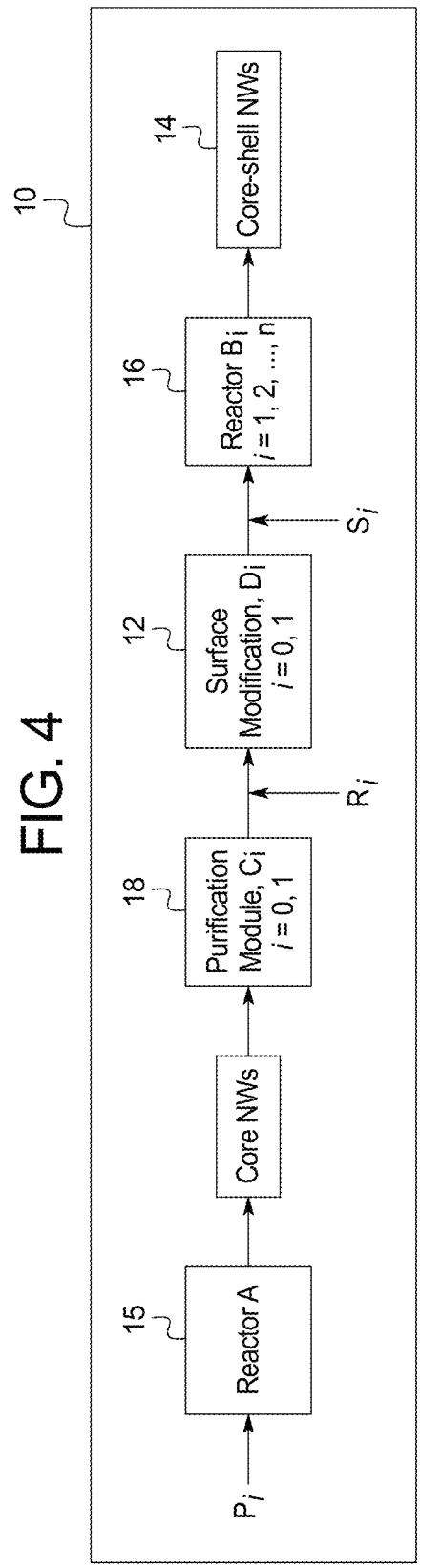
FIG. 4 is a schematic of a general reactor configuration and method for core/shell nanowire production disclosed herein, wherein core nanowire precursors, $P_i$, are introduced to a first reactor to produce core nanowires, wherein the core nanowires are optionally purified in a purification module, wherein the (purified) core nanowires are combined with additional reagents, $R_i$, to form a core nanowires suspension, wherein the core nanowires suspension is optionally fed through a reactor for surface modification, wherein the (modified) core nanowires suspension is combined with shell precursor materials, $S_i$, wherein the mixture of core nanowires suspension and shell precursor materials flows through a (series of) coating reactor(s) to produce coated nanowires.

The disclosure also provides methods 10 for manufacturing CdSe/ZnS nanowires 14. The general method may include (1) synthesis of CdSe parent nanowires, and (2) coating of the CdSe nanowires with a ZnS shell. Examples of the methods 10 are displayed in FIGS. 1-4. As shown in FIGS. 1-4, the methods 10 may include a coating Reactor B 16, which may be a simple round bottom flask or a micro or macro fluidic continuous flow reactor that may be used to create the CdSe/ZnS core/shell nanowires 14. As shown in FIG. 3-4, the method 10 may include a first Reactor A 15 for producing the CdSe parent nanowires, a second surface modification Reactor D 12 may be used to modify the surface of the CdSe parent nanowires, and the third Reactor B 16 may be used to coat the CdSe nanowires with a semiconductor coating to produce core/shell nanowires 14.

The disclosure also provides general methods 10 for manufacturing core/shell nanowires 14. The general method may include (1) synthesis of core nanowires in Reactor A 15, (2) the optional purification of the core nanowires in Module C 18, (3) the optional surface modification of the core nanowires in Reactor D 12, and (4) coating of the core nanowires with a shell coating in Reactor B 16 to produce core/shell nanowires 14. Each of the steps in the process can be performed entirely in a single continuous flow apparatus, such as the apparatus described in U.S. patent application Ser. No. 14/446,285, incorporated herein by reference in its entirety, or may be performed outside of the apparatus. Examples of the methods 10 are displayed in FIGS. 2-4. As shown in FIGS. 2-4, the methods 10 may include a coating Reactor B 16, which may be a micro or macro fluidic continuous flow reactor that may be used to create the core/shell nanowires 14. As shown in FIG. 2-4, the methods 10 may include a first Reactor A 15 for producing the core nanowires. In certain examples, the Reactor D 12 may be used to modify the surface of the parent nanowires, and the Reactor B 16 may be used to coat the parent nanowires with a semiconductor coating to produce core/shell nanowires 14.

The methods 10 may use the first Reactor A 15 for producing the CdSe nanowires that includes a conduit (e.g., PTFE tubing) that is thermally coupled or encased in a heat-transfer material (e.g., an aluminum plate or heat transfer fluid/oil bath), where the temperature is controlled using a heat source (e.g., a hot plate). The coating Reactor B 16 may include a larger diameter (0.15875 cm ID) conduit (e.g., PTFE tubing) than the Reactor A 15 for the core nanowires (0.079375 cm ID), where the coating reactor conduit is thermally coupled to a heat source (e.g., the conduit is coiled through a heat transfer fluid/oil bath) to maintain the coating reaction temperature.

In certain embodiments, use of a flow reactor such as a microfluidic reactor is preferred over a batch reactor as the microfluidic reactor allows for greater control over reaction conditions, and imparts greater heat and mass transfer, which may lead to higher yields. Extra controls may also be added to the reactor configuration for in-line modification of process parameters and analyses.

Figure 5:
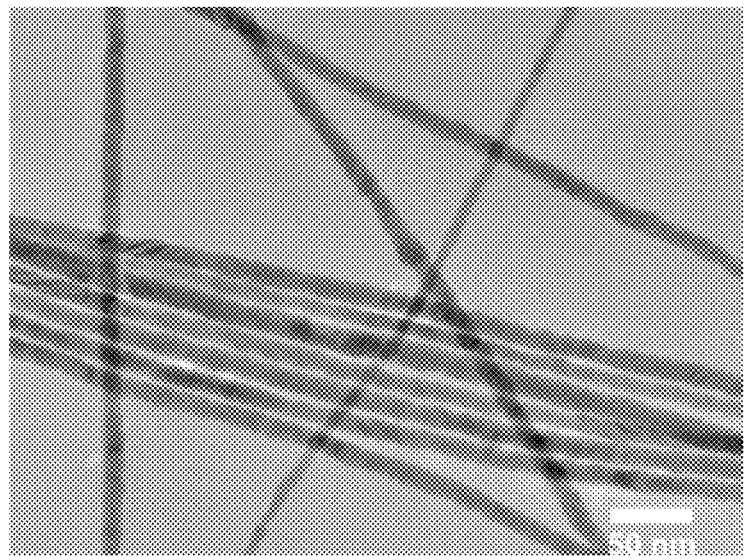

For a given run, the coating pump may be initially bypassed, and the parent core nanowires produced in a quantity sufficient to perform characterization and control experiments on the core nanowires. Thereafter, the bypass may be shut off and the core nanowires may be fed to the coating reactor system, wherein the remainder of the run produces the core/shell nanowires. An example micrograph of core nanowires before the coating process is shown in FIG. 5. Here, smooth, straight CdSe nanowires have been produced for coating.

Additionally, it may be beneficial to control the concentration of the shell precursor, since the concentration may be used to change the thickness of the shell, which in turn may influence the fluorescence properties of the resulting product. According to Talapin et al. and Murray et al. a small amount of ZnS monolayers lead to higher quantum yields in quantum dot counterparts. [34,35] The concentration of the shell precursor solution may be altered by a control that may increase the amount of solvent in the shell precursor solution to dilute the concentration to an optimal concentration. For example, differential flow rates may be used, where the flow rate of the nanowire suspension would be introduced to the shell precursors at an optimal ratio. The shell precursors are present typically in large excess compared to the amount of core nanowires solution in order to produce of core/shell nanowires.

The methods 10 may be successfully employed irrespective of the chosen parent nanowire synthesis method. The synthesis of the parent semiconductor nanowire in Reactor A 15 can be performed via the methods and apparatus described in U.S. patent application Ser. No. 14/446,285, or may be performed via conventional solution methods such as using hot-injection batch Solution-Liquid-Solid (SLS) techniques or by other solvothermal or oriented attachment techniques. However, parent nanowires produced in a continuous flow process, such as in a microfluidic reactor, are particularly advantageous. For example, continuous flow processes have the advantage that they are capable of large-scale production due to better heat and mass transfer.

Additionally, the methods 10 may be successfully employed irrespective of the chemical reagents used in producing the core nanowires. In an example, CdSe nanowires may be produced in a flow reaction from 1) a cadmium oleate solution formed by combining oleic acid and cadmium oxide solution in an organic solvent in the presence of an organophosphorus compound at 250° C.-320° C., and 2) a selenium solution containing catalyst particles formed from trioctylphosphine-selenide and bismuth chloride in 1-methyl-2-pyrrolidinone. The selenium solution and cadmium oleate solution may be combined and flowed through a microfluidic reactor to produce CdSe nanowire. In the methods 10 provided herein for the production of the core CdSe nanowires, cadmium oxide is used as the cadmium source. However, other cadmium sources, such as cadmium acetate may be used. Similarly, the selenium source is not limited to trioctylphosphine-selenide and selenium-octadecene (Se-ODE), which are used in the examples. The oleic acid used to form the metal/fatty acid precursor Cd/oleic acid may be replaced with other Cd/fatty acid combinations such as Cd/octanoic acid, Cd/stearic acid, or Cd/myristic acid for example. Various other reagents may be included or substituted, including alkyl amines (e.g. oleylamine or hexadecylamine), or phosphinic acids.

The next optional step in the method 10 is the purification of the core nanowires in Module C 18. The conventional method of nanowire purification, involving repeated centrifugation and re-suspension steps may be used. The present methods may simplify the purification step to spinning the wires out of the reaction mixture, which may include adding methanol to precipitate the NWs, without the additional toluene washes. Alternate in-line methods of purification may include such devices known to those skilled in the art such as a microfluidic concentrator or an inertial filter.

In a specific example, the CdSe product may be collected and purified, resuspended in solvent, and degassed while stirring in a container, such as a round bottom flask, to form a CdSe suspension. For example, the CdSe NWs in the disclosed method may be centrifuged and washed in toluene, and methanol may be added to precipitate the wires as needed. In other examples, depending on the precursors used in the growth solution (for example, when the fatty acid is stearic acid instead of oleic acid), CdSe wires may be washed in pyridine with hexane added to precipitate the NWs as needed. The CdSe wires may then be washed twice in toluene to remove the pyridine. The present methods may simplify the purification step to spinning the wires out of the reaction mixture, which may include adding methanol to precipitate the NWs, without the additional toluene washes.

The purification step may increase the yield of coated wires by removing excess ligands and by-products from the core nanowire synthesis. The purified nanowire product may be resuspended in any suitable solvent. For a specific example, the purified CdSe may be brought up in chloroform, octadecene, squalane, as well as other organic solvents. Non-coordinating solvents are typically preferred to achieve success in coating nanowires, while quantum dots are overcoated almost exclusively in coordinating solvents. The resuspended CdSe product may be dried and degassed under reduced pressure. The degassing step may remove chloroform (i.e. the nanowire transfer solvent) from the mixture. The core nanowire suspension may be any suitable concentration, where the concentration is typically on the order of $10^{-12}$ M, while the shell reagents introduced with the core nanowires into Reactor B 16 are present in concentrations 9 or 10 orders of magnitude higher than the core nanowires.

The purification and degassing may be used when coating in a batch mode and may further improve the yield of coated wires when using flow conditions. The purification may be performed in a purification module 18, as shown in FIG. 4 where i=1 for Module C 18. Without being bound by theory, it is believed that this may be a concentration issue, where excess ligands from the CdSe synthesis may need to be removed first in order for the shell precursors to react on the nanowire surface during the coating step. Under flow conditions, the problems surrounding any excess ligand may be resolved by tuning the flow rate to control the amount of shell and core material that are able to react. For example, differential flow rates may be used to introduce the as-synthesized core nanowire solution and the shell precursors at an optimal ratio, in which the shell reagents are present in a much higher concentration.

The methods 10 may include surface modification after the core nanowire synthesis step and before the shell coating process. Surface modification can be performed on as-synthesized or purified nanowires. For example, a surface modification Reactor D 12 may be in line after the first Reactor A that produces the core nanowires and before the Reactor B 16 that is used to coat the nanowires with the shell, as in FIG. 3 and in FIG. 4 when i=1 for Reactor D 12. The surface modification may include the nanowires and one or more surface modification chemicals (e.g. amines or acids), through a surface modification reactor at an elevated temperature, for example from 50° C.-120° C., for an extended period time, such as 20 minutes to 12 hours. Without being bound by theory, the surface modification may include creation of defect sites via chemical etching for nucleation of the shell material [9] or surface modification may also include a surface ligand exchange, which can improve the coating efficiency [1,8] or tune the shell morphology. [9] Example reagents used in the surface modification reactor may include amines (e.g. pyridine, hexadecyl amine, or oleyl amine), phosphines (e.g. trioctylphosphine), acids (e.g. oleic acid), or other chemicals known to coordinate or react with the nanowire surface.

The coating step requires the selection of the shell precursor solution, which is combined with the core nanowires in Reactor B 16. The shell precursor solution may be used in a flow or batch Reactor B 16. For example, in a batch method, the shell precursor solution may be added all at once via hot-injection or added at a controlled rate, such as in dropwise fashion, into the nanowire suspension under an inert atmosphere. Alternatively, under flow conditions, the nanowire suspension and a shell precursor solution may be loaded into separate syringes or feed lines, which may then be combined via a mixing connector into a single solution, where the solution flows through a coating Reactor B 16. Of course, additional feed lines may be in communication with any of the reactors for other reagents, or solvents, among others. The shell may be annealed for a specific time at a specific temperature. The coating reactor conditions may be manipulated to control the shell morphology, for example.

In a specific example, CdSe parent nanowires are coated with a ZnS shell. The method 10 includes selecting or preparing a shell precursor solution that is used to coat the parent nanowires with the semiconductor shell. The shell precursor can be a single chemical that decomposes during the coating process to release zinc and sulfur, which interact with the CdSe nanowires in the presence of the other reagents in the solution to form a ZnS coating on the CdSe nanowires. Alternatively, the precursor may contain multiple chemicals, such that zinc and sulfur are provided by different chemicals.

Wang et al. synthesized CdSe/ZnS quantum dots by producing TOPO-capped and ODE-capped CdSe core quantum dots. [2] The shell precursor was the single source chemical zinc diethyldithiocarbamate (1.0 g) dissolved in trioctylphosphine (15.0 mL). Equal volumes of as-synthesized CdSe quantum dots and ZnS precursor solution were mixed and flowed through a microfluidic reactor. The TOPO-CdSe (ODE-CdSe) was coated at 240° C. (150° C.). Residence coating times ranged from 0 to 140 seconds. Wang et al. found that their core/shell product achieved the highest fluorescence intensity at 14 and 28 second residence times. [2] Comparative Example 1 is a failed attempt to adapt this CdSe/ZnS quantum dot procedure to make CdSe/ZnS nanowires.

The shell precursor solution may include single-source zinc diethyl dithiocarbamate (ZDC), which contributes zinc and sulfur elements to the shell coating. Alternatively, the shell precursor may be substituted with a different zinc or sulfur source. For example, alternative ZnS precursors include diethyl zinc as a zinc source and hexamethyldisilathiane as a sulfur source. However, these alternative precursors may pose problems because they are air-sensitive and highly flammable, which makes them dangerous to handle as well as not conducive to large-scale production. Diethyl zinc and hexamethyldisilathiane have previously been used as Zn and S sources, respectively, to make ZnS coating in QD and nanorod syntheses [8,34] and may be used in the present method.

The examples of methods 10 used herein employ zinc diethyl dithiocarbamate as a precursor for ZnS shell coating on CdSe core nanowires because of its many advantages, including being a single-source precursor (containing both zinc and sulfur elements), a milder and safer compound to handle, and considerably less expensive compared to the alternatives (diethyl zinc and hexamethyldisilathiane). ZnS capped nanocrystals have been produced from zinc diethyl dithiocarbamate dissolved in mixtures that include trioctylphosphine. [2,20] However, attempts by Li et al. to use zinc hexadecylxanthate, another single-source shell precursor, to coat CdSe nanowires with ZnS were not successful. [9] Further, zinc hexadecylxanthate is not commercially available and requires a multi-step procedure to synthesize.

In addition, the shell precursor solution may include solvents and ligands such as trioctylphosphine, oleylamine, and oleic acid. In an example, the shell precursor solution includes zinc diethyl dithiocarbamate in oleylamine and octadecene. However, the shell precursor solvent is not limited to those presented.

For example, a CdSe nanowire suspension and a ZnS precursor solution may be flowed through a mixing connector and the resulting solution fed into Reactor B 16, which may be a single coating reactor or a series of coating reactors. The core CdSe nanowire suspension may be flowed into a second continuous Reactor D 12 that is maintained at 90° C. for surface modification of the nanowires. The suspension of the surface modified nanowires exiting Reactor D 12 and the ZnS shell precursor solution may then be combined in a connector and fed into a third Reactor B 16 that is maintained between, and including, 100° C. to 200° C. for the coating of the zinc sulfide shell.

Ideally, CdSe/ZnS nanowires may be synthesized in-line, as the in-line flow process may also help eliminate unnecessary steps (purification and degassing), and may allow as-synthesized CdSe to be mixed directly with the shell reagents going into the coating Reactor B 16. For example, instead of preparing and purifying a CdSe product as described above, the reagent feed lines to make CdSe nanowires may be combined into a first feed line, which is pumped through a flow Reactor A to produce CdSe nanowires. In such example, the coating may be applied to the as-synthesized CdSe. The reagents for the shell coating may be loaded into separate syringes or feed lines. For example, a second syringe or second feed line may contain a shell precursor solution, and a third syringe or third feed line may contain other coating reagents. The second and third syringes may be combined into a single coating materials stream via a connector or mixer. The as-synthesized CdSe nanowires stream may then be combined directly with the coating materials stream via a connector or mixer into a single solution, and the solution may flow through a Reactor B 16 to anneal the ZnS shell.

In another example, a CdS coating is applied to a CdSe core nanowire. The following considerations were reviewed for selecting the shell precursor. While the highly reactive dimethyl cadmium has been successfully used to produce CdSe/CdS core shell nanowires, dimethyl cadmium is strongly pyrophoric which necessitates the use of a glovebox and air-free conditions. A milder cadmium source of cadmium hexadecylxanthate (Cd-HDX) may be used as a single source precursor for our CdS coat. Cd-HDX is straightforward to make in a multi-step synthesis procedure and can be handled in air, unlike dimethyl cadmium.

The present method 10 may also include the use of cadmium ethyl xanthante (Cd-EtX) in the synthesis of CdSe/CdS core/shell nanowires. Cadmium ethylxanthate may be formed in a single precipitation step from aqueous solutions of commercially available potassium ethyl xanthate and cadmium chloride. Cadmium ethyl xanthate is much more reactive and decomposes faster than cadmium hexadecyl xanthate, [36] resulting in the near exclusive production of free CdS nanocrystals. The present methods 10 successfully optimized the formation of CdSe/CdS core/shell nanowires using cadmium ethyl xanthate as the precursor. In the CdSe/CdS core/shell nanowire example, when using the more reactive cadmium ethyl xanthate as the CdS shell precursor, the coating may be very rough and spiky compared to those produced with the milder cadmium hexadecyl xanthate. The overcoating annealing temperature may also depend on the shell precursor materials and may be subsequently optimized to achieve a uniform shell coating when using cadmium ethyl xanthate. For example cadmium ethyl xanthate typically requires relatively low temperatures (90° C.), while cadmium hexadecyl xanthate typically requires higher temperatures (130° C.) since it is less reactive.

The present method 10 may include temperature sensitive steps. Temperatures for the core nanowire synthesis via SLS methods are typically between 170° C. and 300° C. Temperatures for CdSe nanowire synthesis are typically between, and including, 220° C. and 250° C. In the case of CdSe/ZnS, the ZnS shell coating temperature may have a relatively narrow range, where temperatures as low as 160° C. do not yield coated wires. Likewise, CdSe core nanowires may degrade in the TOP solvent mixture at temperatures above 200° C., before they may be coated. As a result, annealing temperatures in the coating step may be maintained between 160° C. and 200° C. in the various methods, although in some cases temperatures between 190° C. and 200° C. are preferred. The CdSe/CdS overcoating process is less sensitive, in that the nanowires were coated at temperatures as low as 90° C. and up to 130° C. depending on the chosen shell precursor material. When using a cadmium ethyl xanthate shell precursor, nanowires were successfully coated at 90° C., while a cadmium hexadecyl xanthate shell precursor required higher temperatures (approximately 130° C.).

Various embodiments of the present methods employ a minimum shell annealing time. Typically, a shell may be annealed for a minimum of 10 min. For example, the shell may be annealed for at least 10 min, 15 min, 20 min, 30 min, 50 min, or 70 minutes. The shell may be annealed for less than 24 hours, less than 15 hours, less than 10 hours, less than 5 hours, less than 3 hours, or less than 1 hour. For example, the shell may be annealed for a time between any of the above end points. For example, the shell may be annealed between, and including, 10 min to 1 hour, 10 min to 30 min, or 30 min to 1 hour.

For example, annealing for 10 min did not produce coated CdSe/CdS nanowires. Longer times (4-15 hrs) led to spiky rod-like CdS structures protruding from the CdSe surface, while shorter times produced noticeably smaller spikes.

The shell morphology may be modified dramatically depending on the coating conditions, usually by changing the reactor type (batch or flow) and adjusting the annealing time. In experiments with CdSe/CdS nanowires, the CdS shell varied in appearance from spiky, rod-like protrusions to smaller island structures to uniform bumps on the CdSe core wires. Li et al. observed that the formation mechanism for core/shell nanowires was highly dependent on the ligands used in the process.[9]

The present compositions and methods, including CdSe/ZnS core/shell semiconductor nanowires, may be used in various ways and in various systems and devices to provide certain benefits and advantages. Uses include nanoscale electronics, optoelectronics, chemical sensors, biological sensors, optical sensors, polarization sensors, energy harvesting and storage, flexible electronics, photocatalysis, printed electronics, solar cells, and gas sensors among others. For example, the unique optical, electronic, and physio-mechanical properties of CdSe/ZnS core/shell semiconductor nanowires may improve the performance of such systems and devices.

The core/shell nanowires are extremely stable under a variety of conditions. Testing of the photo- and air-stability was done using a Tungsten Halogen Light (Ocean Optics, HL-2000-HP) and a UV-VIS spectrometer. The nanowires were irradiated by the lamp for 2-5 hours and the absorption (optical density at 705 nm) monitored with time. [37] Both the core/shell samples (CdSe/ZnS and CdSe/CdS) and the parent CdSe samples were stable to irradiation in ambient conditions. There are reports that certain chemicals enhance degradation, [38,39] so various ligands (TOPO, DOPA, and oleic acid) were added to test for such chemical etching. No difference was seen in these samples.

EXAMPLES

Example 1

Materials. 1-methyl-2-pyrrolidinone (99.5%, Aldrich), 1-octadecene (90%, Aldrich), acetonitrile (99.9%, Fisher Chemical), bismuth (II) chloride (99.999%, Strem), cadmium oxide (99.5%, Aldrich), diphenyl ether (99%, Aldrich), methanol (ACS grade, VWR), oleic acid (90%, Aldrich), oleylamine (70% Aldrich), selenium (99.99%, Strem) trioctylphosphine (90%, Aldrich), trioctylphosphine oxide (99%, Strem), toluene (ACS grade, VWR), and zinc diethyl dithiocarbamate (97%, Aldrich) were used as received. 1M TOP-Se was prepared by dissolving selenium powder in trioctylphosphine under inert atmosphere; trioctylphoshine oxide (TOPO) was recrystallized from acetonitrile prior to use; di-n-octylphosphinic acid (DOPA) was synthesized according to the procedure reported by Wang et. al., [40] a stock suspension of 2 mM BiCl3 in NMP was prepared in advance. The synthesis follows the method of FIG. 1. The reactors for both the core nanowire synthesis and shell coating were round-bottom flasks and the processes were carried out under inert atmosphere using standard Schlenk line techniques.

Batch hot-injection synthesis of core CdSe nanowires. Trioctylphosphine oxide (2.75 g), cadmium oxide (0.05 g), di-n-octylphosphinic acid (0.012 g), oleic acid (0.8 mL), octadecene (1.0 mL), diphenyl ether (1.6 mL) are added to a round bottom flask. Reagents are degassed at 80° C. for 1 hr on a Schlenk line, then switched to an inert atmosphere. The temperature is raised to 300° C., whereupon a clear cadmium-oleate solution is formed at 290° C. The temperature is thereafter stabilized at 240° C., whereupon a mixture of 1 M trioctylphosphine-selenide (50 µL) and 2 mM bismuth chloride in 1-methyl-2-pyrrolidinone (30 µL) is combined in a syringe, injected into the cadmium-oleate, and annealed for 2 minutes. Toluene (10.0 mL) is injected to cool the solution to room temperature and to prevent the TOPO from solidifying. The CdSe nanowires product is collected and split into two equal parts, which are both purified according to conventional centrifugation procedures. The nanowires are washed with toluene, with methanol added as necessary to precipitate the wires. One half of the product was used in the following shell overcoating (the other half was set aside for a future synthesis). FIG. 5 is a TEM image of an example of CdSe parent wires prior to coating.

Batch hot-injection synthesis of CdSe/ZnS core/shell nanowires. A 0.055 M shell precursor was prepared by dissolving zinc diethyl dithiocarbamate (140 mg) in a mixture of oleylamine (2.0 mL) and octadecene (5.0 mL), followed by sparging with $N_2$ for 10 min to form the zinc sulfide shell precursor solution. The cadmium selenide nanowire pellet was transferred into a round bottom flask using chloroform (2.0 mL). Additional reagents including oleic acid (1.0 mL), oleylamine (1.0 mL), and trioctylphosphine (5.0 mL) were added to the vessel. The suspension was degassed at 50° C. for 15 min, then switched to an inert nitrogen atmosphere and stabilized at 190° C. The shell precursor solution was injected into the suspension and annealed at 190° C. for 30 min. The CdSe/ZnS nanowires product was collected and purified according to conventional centrifugation procedures. The nanowires were washed with toluene, with methanol added as necessary to precipitate the wires.

Figure 6:
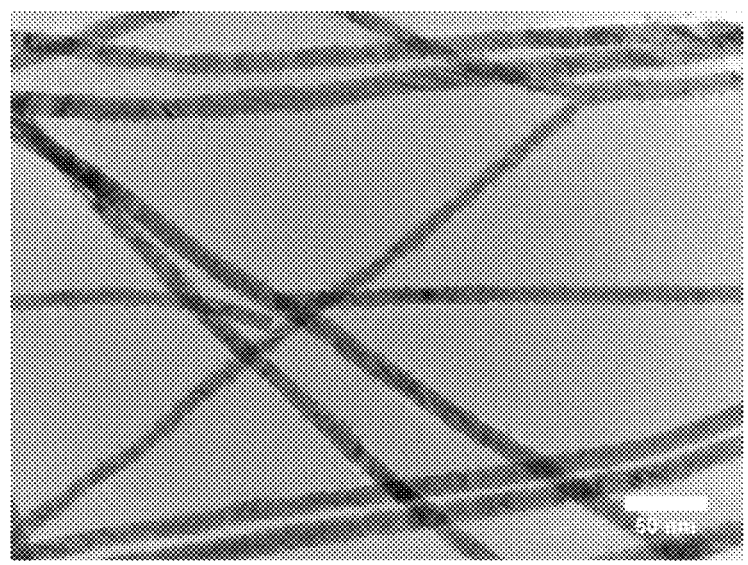
FIG. 6 is a TEM image taken of CdSe/ZnS nanowires produced using traditional batch injection techniques according to Example 1.

FIG. 6 is a TEM image of CdSe/ZnS nanowires produced in Example 1. Resulting (CdSe) CdSe/ZnS nanowires had average diameters of (12.06±3.21 nm) 16.49±3.11 nm, with an average ZnS shell thickness of 2.22 nm.

Example 2

Materials. Chemical sources and preparations are described in Example 1. The synthesis follows the method of FIG. 2. The reactor for the core nanowire synthesis was a round-bottom flask and the process was carried out under inert atmosphere using standard Schlenk line techniques. The continuous flow reactor for coating included two reactors in series, each with 300 cm of PTFE tubing (0.15875 cm ID, McMaster Carr) coiled through a deaerated 1-octadecene inside a 250 ml round-bottom flask; connections to the tubing were made with syringe adapters and mixing connectors from Idex-HS, syringe pumps were used to propel the solutions along the tubing.

Batch hot-injection synthesis of core CdSe nanowires. The synthesis and purification of the CdSe core nanowires follows the same procedure in Example 1. One half of the CdSe product was used in the following shell overcoating.

Continuous flow synthesis of CdSe/ZnS core/shell nanowires. A 0.055 M shell precursor is prepared by dissolving zinc diethyl dithiocarbamate (140 mg) in a mixture of oleylamine (2.0 mL) and octadecene (5.0 mL), followed by sparging with N2 for 10 min to form the zinc sulfide shell precursor solution. The cadmium selenide nanowire pellet is transferred into a round bottom flask using chloroform (2.0 mL). Additional reagents including oleic acid (1.0 mL), oleylamine (1.0 mL), and trioctylphosphine (5.0 mL) are added to the mixture. The mixture is degassed for 15 min at 50° C. on a Schlenk line, then switched to an inert atmosphere to form the CdSe nanowire suspension. The CdSe nanowire suspension and the ZnS shell precursor solutions are loaded into separate syringes and connected to a syringe pump for flowing through the continuous flow reactor. The two solutions are combined in a connector into a single solution, which is flowed at 0.13 mL/min through two coating continuous flow reactors connected in series and maintained at 200° C. The shell is annealed for a total residence time of 108 minutes in the reactors.

Figure 7A:
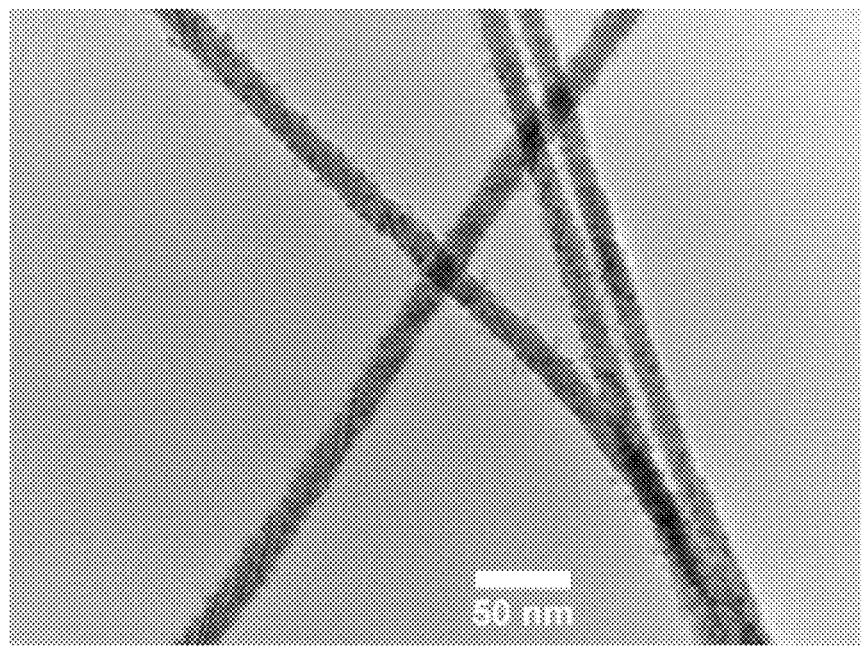
FIGS. 7a-7c represent analysis of CdSe/ZnS nanowires produced using a flow reaction in Example 2.
Figure 7B:
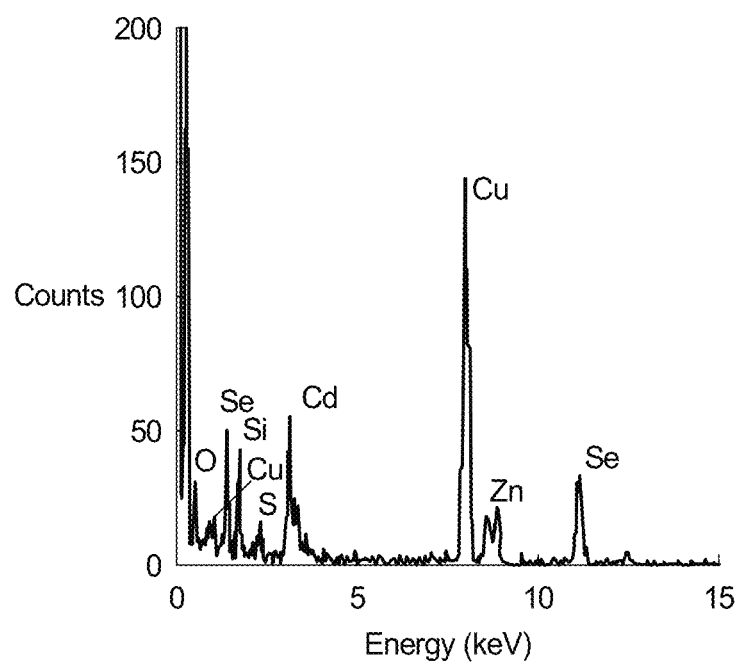
Figure 7C:
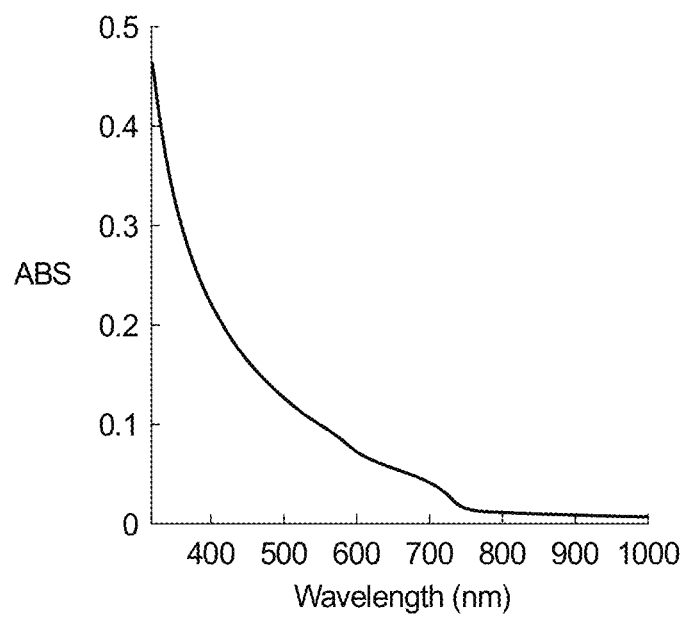

FIG. 7a is a TEM image of CdSe/ZnS nanowires produced in Example 2. Resulting (CdSe) CdSe/ZnS nanowires had average diameters of (15.54±2.84 nm) 21.91±4.81 nm, with an average ZnS shell thickness of 3.19 nm. FIG. 7b shows the energy-dispersive X-ray spectroscopy (EDX) analysis of CdSe/ZnS nanowires in Example 2 depicting the respective elemental composition. The EDX indicates that the nanowires show the presence of zinc and sulfur, indicating a ZnS coating of the CdSe nanowires which is also evident in the TEM images in FIG. 7a. FIG. 7c shows the UV-Vis spectra of the CdSe/ZnS nanowires in Example 2.

Example 3

Materials. 1-methyl-2-pyrrolidinone (99.5%, Aldrich), 1-octadecene (90%, Aldrich), acetonitrile (99.9%, Fisher Chemical), BiC13 (99.999%, Strem), CdO (99.5%, Aldrich), diphenyl ether (99%, Aldrich), methanol (ACS grade, VWR), oleic acid (90%, Aldrich), oleylamine (70% Aldrich), selenium (99.99%, Strem) trioctylphosphine (90%, Aldrich), trioctylphosphine oxide (99%, Strem), toluene (ACS grade, VWR). 0.1M Se-ODE was prepared by dissolving selenium powder in 1-octadecene at 180° C. for 5 hr under inert atmosphere according to the procedure by Bullen et al.; [41] trioctylphoshine oxide (TOPO) was recrystallized from acetonitrile prior to use; di-n-octylphosphinic acid (DOPA) was synthesized according to the procedure reported by Wang et. al.; [40] a stock suspension of 2 mM BiC13 in NMP was prepared in advance; cadmium ethyl xanthate was prepared from aqueous solutions of cadmium chloride (99+%, Strem) and potassium ethyl xanthogenate (97%, Aldrich). The synthesis follows the method of FIG. 3. The continuous flow reactor for core nanowire synthesis is an aluminum block containing a serpentine channel that is lined with a PTFE tubing (ID=0.079375 cm) and heated on a hotplate. The channel in the aluminum block has a length of 100 cm. Connections to the tubing were made with syringe adapters and mixing connectors from Idex-HS, and syringe pumps were used to propel the solutions along the tubing. The surface modification reactor included 200 cm of PTFE tubing (0.15875 cm ID, McMaster Carr) coiled through deaerated 1-octadecene inside a 250 ml round-bottom flask. The continuous flow reactor for coating included 300 cm of PTFE tubing (0.15875 cm ID, McMaster Carr) coiled through deaerated 1-octadecene inside a 250 ml round-bottom flask; connections to the tubing were made with syringe adapters and mixing connectors from Idex-HS; syringe pumps were used to propel the solutions along the tubing.

Continuous flow synthesis of core CdSe nanowires. In this example, CdSe core nanowires are first produced in a continuous flow reactor. The CdSe precursor solution is prepared by adding trioctylphosphine oxide (5.0 g), cadmium oxide (0.12 g), oleic acid (1.2 mL), octadecene (2.0 mL), and diphenyl ether (3.2 mL) to a first flask (A). To a separate flask (B) is added trioctylphosphine oxide (5.0 g), cadmium oxide (0.12 g), oleic acid (1.2 mL), octadecene (2.0 mL), and diphenyl ether (3.2 mL). Reagents in both flasks are degassed simultaneously at 80° C. for 1 hr on a Schlenk line, then switched to an inert atmosphere. The temperature is raised to 300° C., whereupon a clear cadmium-oleate solution is formed at 290° C. Both solutions are cooled to room temperature. Trioctylphosphine (0.1 mL) is injected to the A solution. To solution B is added 0.1 M selenium-octadecene (2.0 mL) and 2 mM bismuth chloride in 1-methyl-2-pyrrolidinone (70 µL). The metal and chalcogenide precursor solutions are added to separate syringes and flowed at 0.24 mL/min to give a 2 min residence time through a metal plate continuous flow reactor held at 240° C. to form a CdSe nanowire product.

The CdSe product is collected and spun down in a centrifuge. Methanol is added as necessary to precipitate the wires, but there are no additional toluene washes. The supernatant is discarded and chloroform (2.0 mL) is used to transfer the nanowires to a new flask. Oleic acid (1.0 mL), oleylamine (1.0 mL), and trioctylphosphine (5.0 mL) are also added to the flask. The mixture is degassed at 50° C. for 15 min, then switched to an inert atmosphere and cooled to room temperature.

Continuous flow synthesis of CdSe/CdS core/shell nanowires. A shell precursor solution is prepared by dissolving cadmium ethyl xanthate (90 mg) in diphenyl ether (7.4 mL) and dimethyl formamide (0.6 mL), followed by sparging with $N_2$ for 10 min. The CdSe nanowires mixture is flowed at 0.09785 mL/min through a first continuous flow reactor for 40 min at 90° C. for surface modification. The CdSe nanowires mixture is then combined with the shell reagent solution, also flowing at 0.09785 mL/min, before annealing for 30 min in a coating continuous flow reactor held at 130° C. The CdSe/CdS nanowires product is collected, then purified with five toluene washes.

Figure 8A:
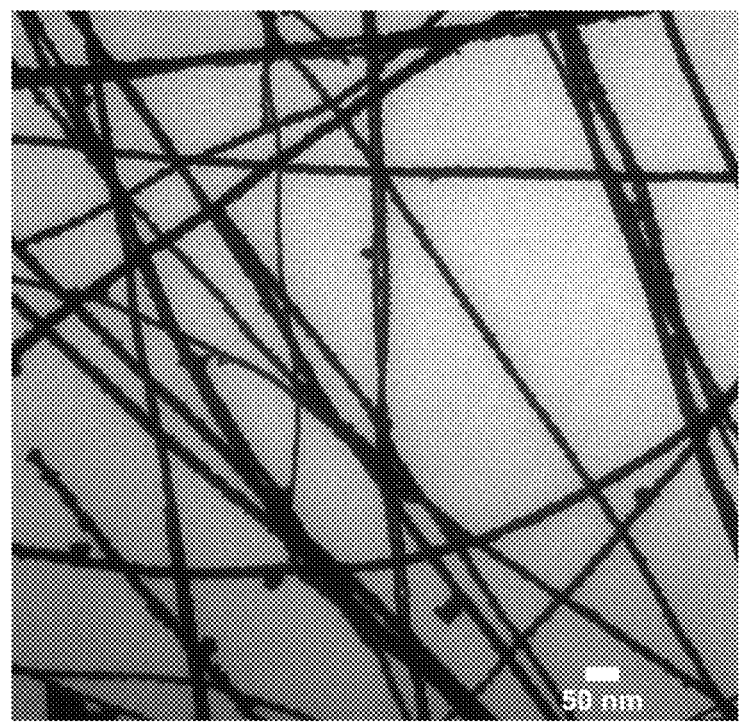
FIG. 8a shows a TEM image of a unique shell morphology for CdSe/CdS nanowires produced using a flow reaction in Example 3.

FIG. 8a shows a TEM image of an example of a unique shell morphology for CdSe/CdS nanowires produced in Example 3. Resulting (CdSe) CdSe/CdS nanowires had average diameters of (11.09±3.4 nm) 16.84±4.61 nm, with an average CdS shell thickness of 2.88 nm.

Figure 8B:
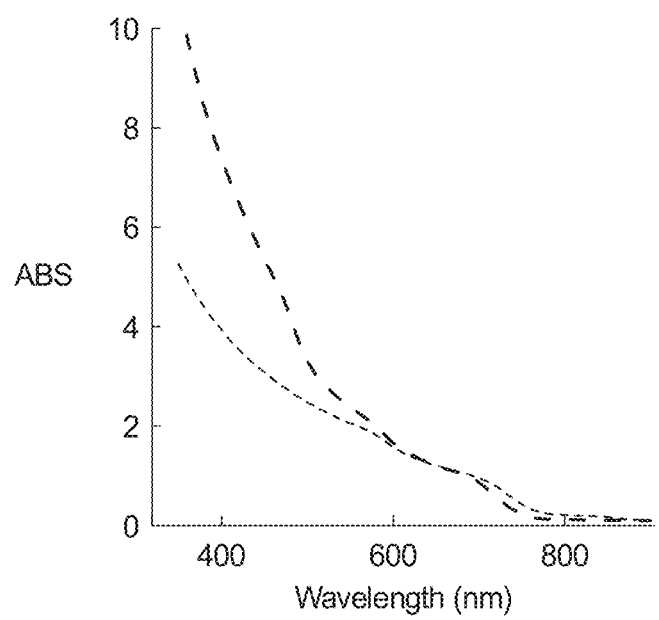
FIG. 8b graphically depicts the UV-Vis absorption spectrum of CdSe/CdS nanowires (dashed line), compared to an uncoated CdSe core nanowire (dotted line).

FIG. 8b illustrates the difference in the optical absorption of CdSe core nanowires (dotted line) and CdSe/CdS core/shell nanowires (dashed line).

Example 4

Materials. Chemical sources and preparations are described in Example 3. The synthesis follows the method of FIG. 3. The reactor for core nanowire synthesis is a round-bottom flask and the process was carried out under inert atmosphere using standard Schlenk line techniques. The continuous flow reactor for surface modification included 200 cm of PTFE tubing (0.15875 cm ID, McMaster Carr) coiled through deaerated 1-octadecene inside a 250 ml round-bottom flask. The continuous flow reactor for coating included 300 cm of PTFE tubing (0.15875 cm ID, McMaster Carr) coiled through deaerated 1-octadecene inside a 250 ml round-bottom flask; connections to the tubing were made with syringe adapters and mixing connectors from Idex-HS, syringe pumps were used to propel the solutions along the tubing; a connector was inserted in-between the two reactor for introducing the shell reagents.

Batch hot-injection synthesis of core CdSe nanowires. CdSe core nanowires were prepared according to the procedure in Example 1, with a minor change in the amount of trioctylphosphine oxide (2.5 g) used. The CdSe nanowires product is collected and split into two equal parts. One half of the product is used in the following shell overcoating (the other half is set aside for a future synthesis). Methanol is added as necessary to precipitate the wires, but there are no additional toluene washes.

Continuous flow synthesis of CdSe/CdS core/shell nanowires. CdSe wires were transferred to a round bottom flask with chloroform. Oleic acid (1.0 mL), oleylamine (1.0 mL), and trioctylphosphine (5.0 mL) were also added to the vessel, which was degassed at 50° C. for 15 min, then switched to a $N_2$ atmosphere and cooled to room temperature. A stock solution of 0.05 M CdS shell precursor was prepared by dissolving cadmium ethyl xanthate (0.18 g) in diphenyl ether (13.8 mL) and dimethylformamide (1.2 mL) followed by sparging with $N_2$ for 20 min. The CdSe wire suspension and 7.0 mL of the shell precursor were added to separate syringes. The CdSe wires were flowed through a first reactor set at 90° C. for a 40 min residence time, then mixed with the shell precursor before flowing through a coating continuous flow reactor set at 130° C. for a residence time of 30 min. The core/shell product was collected and centrifuged. Supernatant was discarded and nanowires were redispersed in toluene and re-centrifuged three times.

Figure 9:
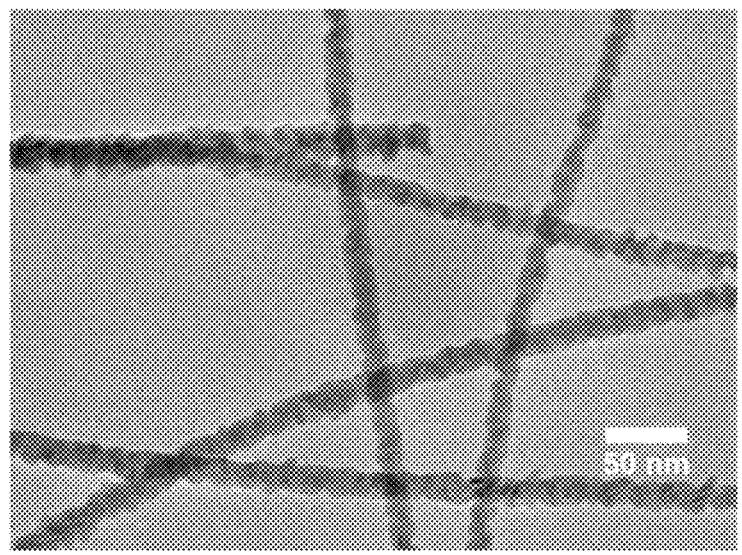
FIG. 9 shows a TEM image of a unique shell morphology for CdSe/CdS nanowires produced using a flow reaction in Example 4.

FIG. 9 shows a TEM image of a unique shell morphology for CdSe/CdS nanowires produced in Example 4. Resulting (CdSe) CdSe/CdS nanowires had average diameters of (13.27±2.58 nm) 22.39±4.8 nm, with an average CdS shell thickness of 4.56 nm.

Example 5

Materials. Chemical sources and preparations are described in Example 3. The reactors for both the core nanowire synthesis and shell coating were round-bottom flasks and the processes were carried out under inert atmosphere using standard Schlenk line techniques.

Batch hot-injection synthesis of core CdSe nanowires. The synthesis of the CdSe core nanowires follows the same procedure in Example 2, with the minor changes in the amounts of co-solvents trioctylphosphine oxide (2.5 g), octadecene (0.4 mL), and diphenyl ether (2.2 mL) used.

The CdSe nanowires product was collected and purified according to conventional centrifugation procedures. The nanowires were washed with toluene, with methanol added as necessary to precipitate the wires.

Batch hot-injection synthesis of CdSe/CdS core/shell nanowires. The CdSe nanowires were transferred to a round bottom flask in chloroform (2.0 mL). Oleic acid (1.0 mL), oleylamine (1.0 mL), and trioctylphosphine (5.0 mL) were also added to the vessel. The suspension was degassed at 50° C. for 1 hr, then switched to an inert nitrogen atmosphere and stabilized at 90° C. A 0.078 M CdS precursor was prepared by dissolving cadmium ethyl xanthate (0.09 g) in octadecene (5.0 mL) followed by sparging with $N_2$ for 20 min. The shell precursor solution was injected into the suspension, and was annealed at 90° C. for 30 min. The solution was subsequently annealed at 130° C. for 4 hrs. The core/shell product was collected and centrifuged. Supernatant was discarded and nanowires were redispersed in toluene and re-centrifuged three times.

Figure 10:
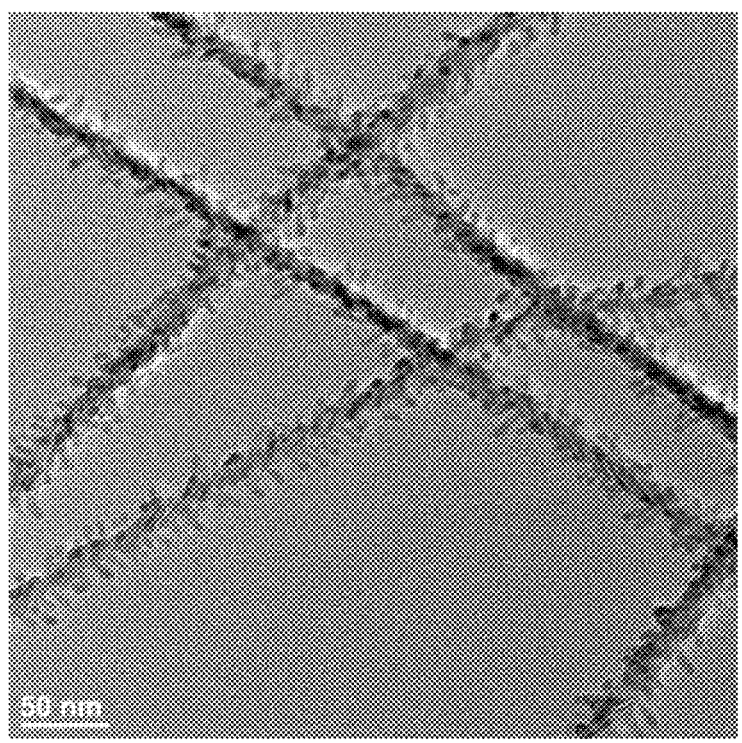
FIG. 10 shows a TEM image of another unique shell morphology for CdSe/CdS nanowires produced using a batch reaction in Example 5.

FIG. 10 shows a TEM image of an example of another unique shell morphology for CdSe/CdS nanowires produced in Example 5. Resulting (CdSe) CdSe/CdS nanowires had average diameters of (13.55±2.91 nm) 30.11±5.15 nm, with an average CdS shell thickness of 8.28 nm.

Example 6

Materials. Chemical sources and preparations are described in Example 3. The reactors for both the core nanowire synthesis and shell coating were round-bottom flasks and the processes were carried out under inert atmosphere using standard Schlenk line techniques.

Batch hot-injection synthesis of core CdSe nanowires. The synthesis of the CdSe core nanowire follows the same procedure as the Example 4. The CdSe product was collected and spun down in a centrifuge. Methanol was added as necessary to precipitate the wires, but there were no additional toluene washes.

Batch hot-injection synthesis of CdSe/CdS core/shell nanowires. The CdSe nanowires were transferred to a round bottom flask in chloroform (2.0 mL). Oleic acid (1.0 mL), oleylamine (1.0 mL), and trioctylphosphine (5.0 mL) were also added to the vessel. The suspension was degassed at 50° C. for 1 hr, then switched to an inert nitrogen atmosphere and stabilized at 90° C. A 0.078 M CdS precursor was prepared by dissolving cadmium ethyl xanthate (0.09 g) in diphenyl ether (4.4 mL) and dimethylformamide (0.6 mL) followed by sparging with $N_2$ for 10 min. The shell precursor solution was injected into the suspension, and was annealed at 90° C. for 30 min. The core/shell product was collected and centrifuged. Supernatant was discarded and nanowires were redispersed in toluene and re-centrifuged three times.

Figure 11A:
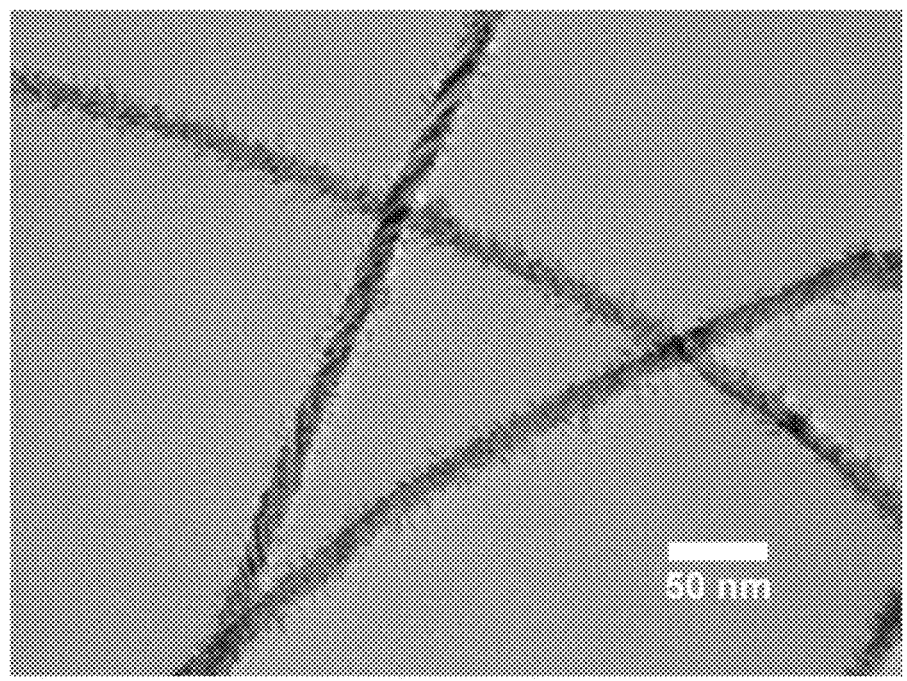
FIG. 11a shows a TEM image of yet another unique shell morphology for CdSe/CdS nanowires produced using a batch reaction in Example 6.
Figure 11B:
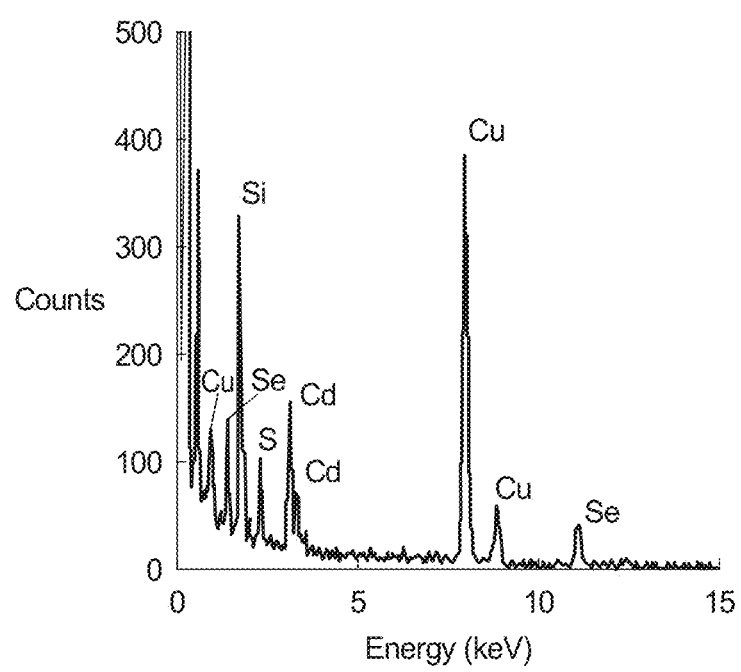

FIG. 11a shows a TEM image of yet another unique shell morphology for CdSe/CdS nanowires produced in Example 6. Resulting (CdSe) CdSe/CdS nanowires had average diameters of (11.8±3.75 nm) 23.05±5.3 nm, with an average CdS shell thickness of 5.63 nm. FIG. 11b shows the energy-dispersive X-ray spectroscopy (EDX) analysis of CdSe/CdS nanowires in Example 6 depicting the respective elemental composition. The EDX indicates that the nanowires show the presence of cadmium and sulfur, indicating a CdS coating of the CdSe nanowires.

COMPARATIVE EXAMPLES

Comparative Example 1

Comparative Example 1 is a failed synthesis of CdSe/ZnS core/shell nanowires when following an adaptation of CdSe/ZnS quantum dot synthesis.[2]

Materials. Chemical sources and preparations are described in Example 1. The reactors for both the core nanowire synthesis and shell coating were round-bottom flasks and the processes were carried out under inert atmosphere using standard Schlenk line techniques.

Batch hot-injection synthesis of core CdSe nanowires. CdSe core wires were synthesized according to Example 4 with the additional step that oleylamine (0.4 mL) was injected into the Cd-oleate solution and degassed for 30 min at 60° C. before continuing with hot-injection of the TOP-Se and BiC13 in NMP mixture at 240° C. under $N_2$. The CdSe product was cooled to 80° C. to discontinue the reaction by spraying the outside of the flask with acetone. No toluene was injected, and there was no purification of the crude CdSe wires prior to coating.

Failed attempt at dropwise addition synthesis of CdSe/ZnS core/shell nanowires. The as-synthesized CdSe nanowire solution was stabilized at 160° C. A 0.043 M ZnS shell precursor was prepared by dissolving zinc diethyl dithiocarbamate (0.11 g) in octadecene (5.0 mL) and oleylamine (2.0 mL). The shell precursor was added dropwise into the crude CdSe nanowire solution at 0.5 mL/min, followed by 10 min annealing at 160° C. The product was purified by washing with toluene and precipitating the wires with methanol.

Figure 12A:
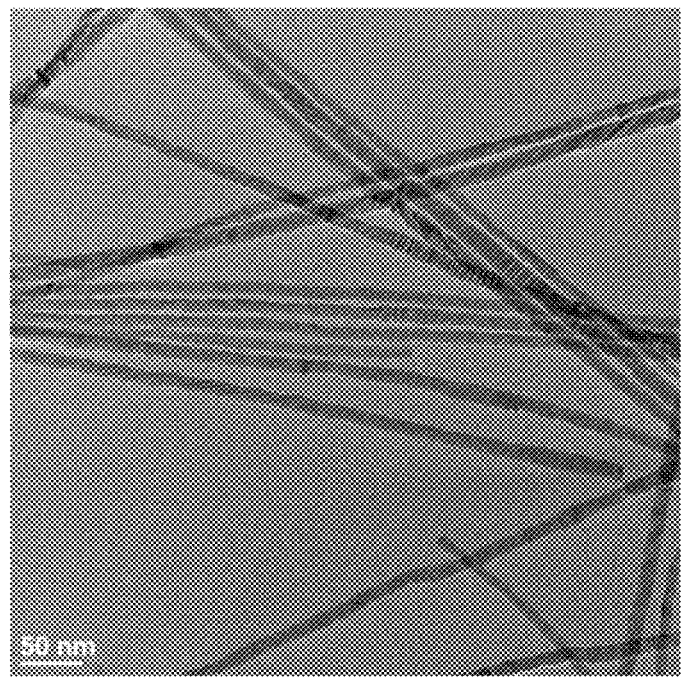
FIG. 12a is a TEM image of resulting nanowires when following an adaptation of CdSe/ZnS quantum dot synthesis [2] in Comparative Example 1.
Figure 12B:
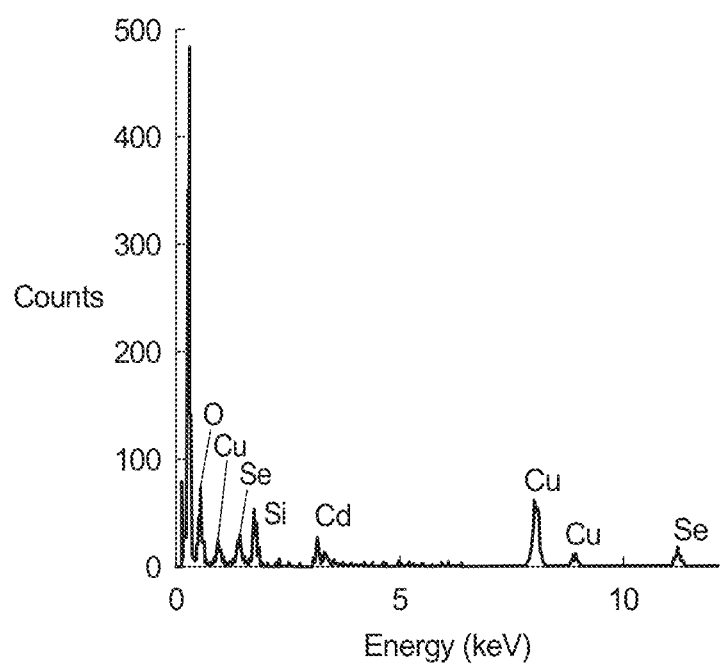

FIG. 12a is a TEM image and FIG. 12b is an EDX of the resulting nanowires produced according to Comparative Example 1. As shown, the EDX confirms no presence of a ZnS shell as there are no Zn or S peaks in the spectrum. In other words, the procedures developed for coating CdSe quantum dots does not result in ZnS coating of CdSe nanowires.

Comparative Example 2

Comparative Example 2 is a failed synthesis of CdSe/ZnS core/shell nanowires when following an adaptation of a CdSe/CdS nanowires synthesis.[9]

Materials. Chemical sources and preparations are described in Example 1. The reactors for both the core nanowire synthesis and shell coating were round-bottom flasks and the processes were carried out under inert atmosphere using standard Schlenk line techniques.

Batch hot-injection synthesis of core CdSe nanowires. CdSe core wires were synthesized according to the method in Example 4. One half of the product was used in the following shell overcoating (the other half was set aside for a future synthesis). Methanol was added as necessary to precipitate the wires, but there were no additional toluene washes.

Failed attempt at batch hot-injection synthesis of CdSe/ZnS core/shell nanowires. The CdSe NWs product was transferred to a round bottom flask using chloroform. Oleic acid (1.0 mL), oleylamine (1.0 mL), and trioctylphosphine (5.0 mL) were also added to the vessel, which was degassed at 50° C. for 15 min, then switched to a $N_2$ atmosphere and stabilized at 160° C. A 0.055 M stock solution of ZnS shell precursor was prepared by dissolving zinc diethyl dithiocarbamate (0.28 g) in octadecene (10 mL) and oleylamine (4.0 mL), followed by sparging with $N_2$ for 15 min. Shell precursor (7.0 mL) was injected into the wire suspension at 160° C. (which resulted in a 15° C. temperature drop) and annealed for 30 min, then cooled to room temperature and purified with three washes of toluene.

Figure 13:
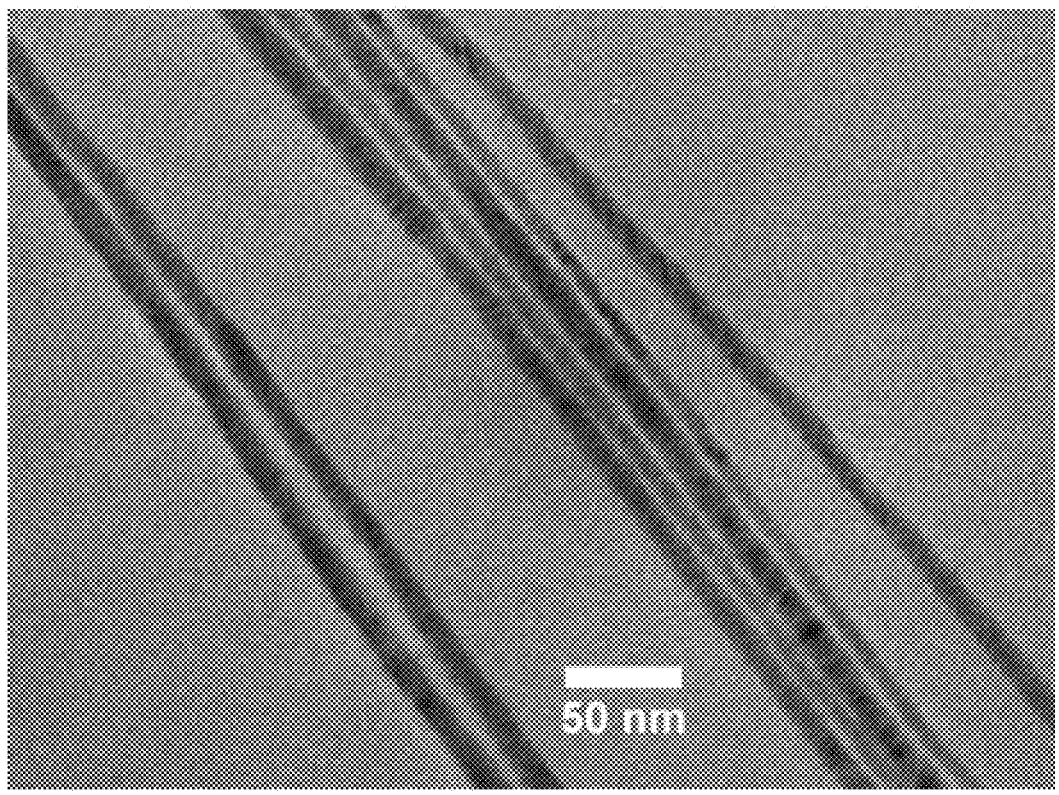
FIG. 13 is a TEM image of resulting nanowires when following an adaptation of a CdSe/CdS nanowires synthesis [9] in Comparative Example 2.

FIG. 13 is a TEM image of resulting nanowires produced in Comparative Example 2 indicates no presence of ZnS shell. In other words, even if the shell precursor materials used in Li et al. [9] are used and annealed for 30 minutes, the resulting nanowires are not coated with ZnS.

Comparative Example 3

Comparative Example 3 is a failed synthesis of CdSe/ZnS core/shell nanowires when following an adaptation of a CdSe/CdS nanowires synthesis.[9]

Materials. Chemical sources and preparations are described in Example 1. The reactors for both the core nanowire synthesis and shell coating were round-bottom flasks and the processes were carried out under inert atmosphere using standard Schlenk line techniques.

Batch hot-injection synthesis of core CdSe nanowires. The procedure follows Comparative Example 2.

Failed attempt at batch hot-injection synthesis of CdSe/ZnS core/shell nanowires. The procedure follows Comparative Example 2, with the exception that the shell reagents were annealed for 60 min instead of 30 min.

Figure 14A:
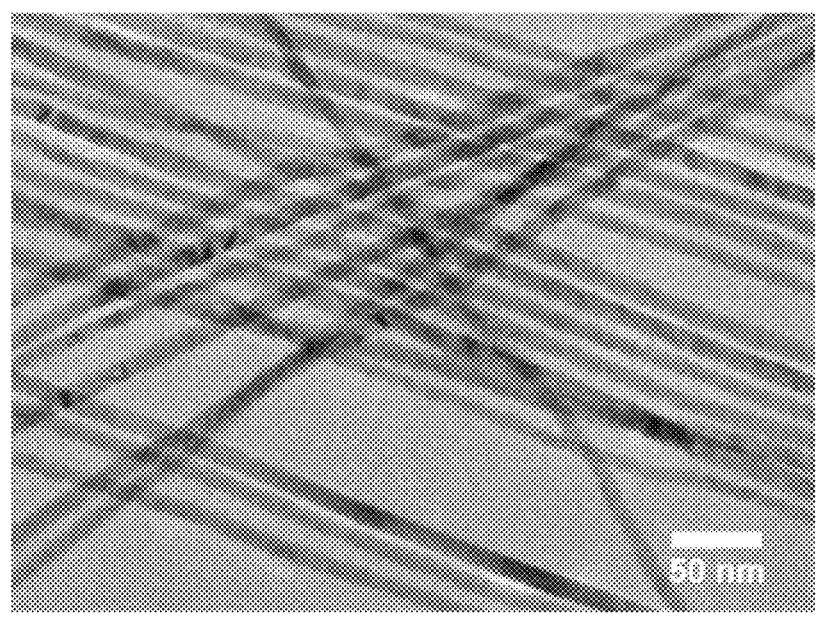
FIG. 14a is a TEM image of resulting nanowires when following an adaptation of a CdSe/CdS nanowires synthesis [9] in Comparative Example 3.
Figure 14B:
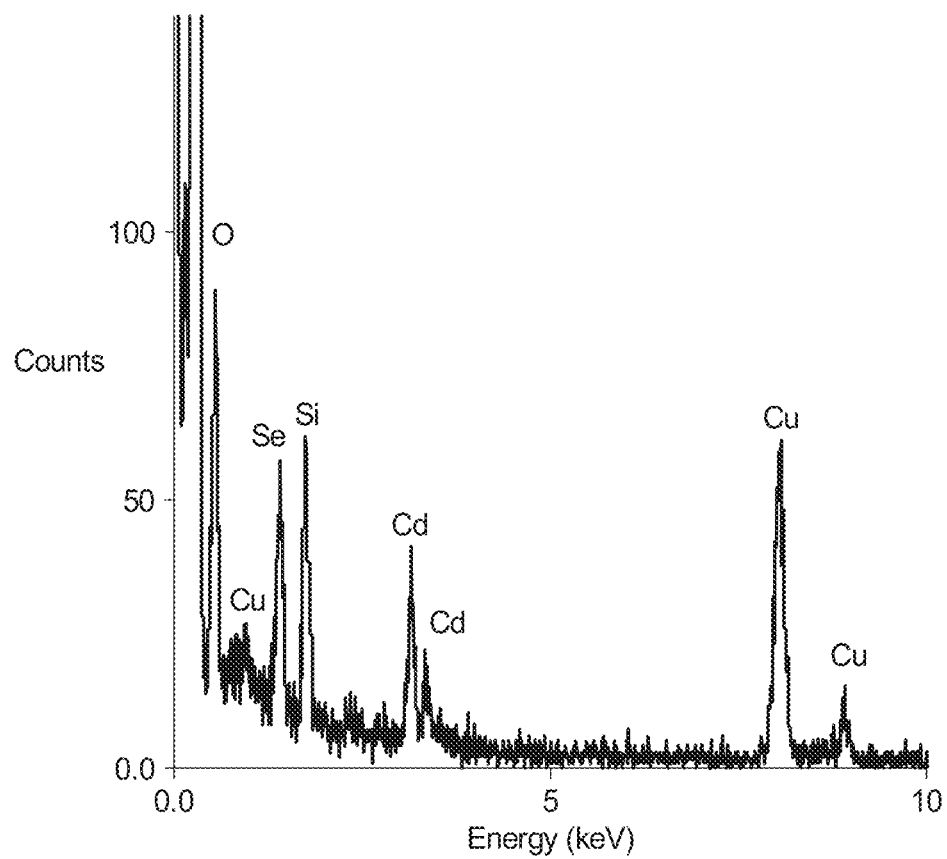

FIG. 14a is a TEM image of resulting nanowires produced in Comparative Example 3 shows no presence of a ZnS shell. FIG. 14b is an EDX of the nanowires produced according to Comparative Example 3 and confirms no presence of a ZnS shell. In other words, even if the shell precursor materials used in Li et al. [9] are used and annealed for 60 minutes, the resulting nanowires are not coated with ZnS.

Comparative Example 4

Comparative Example 4 is a failed synthesis of CdSe/ZnS core/shell nanowires when following an adaptation of a CdSe/ZnS nanorods synthesis.[8]

Materials, chemical sources and preparations are described in Example 1. The reactor for coating is a round-bottom flask and the process was carried out under inert atmosphere using standard Schlenk line techniques.

Batch hot-injection synthesis of core CdSe nanowires. CdSe core nanowires were prepared according to Example 4. The reaction was quenched by spraying the outside of the flask with acetone, without injecting toluene. Oleylamine (1.5 mL) was injected into the as-synthesized CdSe nanowires solution at 60° C., which was then heated for 30 min at 120° C. for ligand exchange.

Failed attempt at dropwise addition synthesis of CdSe/ZnS core/shell nanowires. A 0.13 M ZnS shell precursor solution was prepared by dissolving zinc diethyl dithiocarbamate (0.253 g) in 1-octadecene (2.0 mL) and oleylamine (5.0 mL), followed by sparging with $N_2$ for 20 min. The CdSe nanowires solution was heated to 190° C. The shell precursor was loaded into a syringe and added dropwise at into the CdSe nanowires solution at a flow rate of 0.25 mL/min, followed by annealing for 10 min at 190° C. The solution was cooled to room temperature and the product was collected and purified with toluene.

One of the criteria for confirming the presence of a shell coating includes a visible change in the nanowire surface morphology. Analysis by TEM did not show the presence of a ZnS shell coating. In other words, the procedures developed for coating CdSe nanorods does not result in ZnS coating of CdSe nanowires.

As demonstrated by the comparative examples, applying conventional coating techniques that are used for coating quantum dots and nanorods, even CdSe quantum dots, does not result in CdSe nanowires coated with ZnS. The processes and materials used to create coated quantum dots and nanorods were not transferable to synthesis of coated nanowires. For growth of core/shell QDs and nanorods, shell precursors are often introduced through slow diluted addition, or dropwise fashion, in order to reduce self-nucleation of the shell elements. For example, a dropwise addition of shell reagents for solution based growth of core/shell CdSe/CdS, CdS/CdSe, and CdSe/ZnTe nanowires may be used. However, reports of core/shell QDs produced in microreactors have coating residence times on the scale of seconds, whereas core/shell nanowires growth typically requires a minimum shell reaction time of a few minutes using the dropwise addition, and may even be annealed for 4 hours or more using batch injection of the shell reagents. Further, QD overcoating is also typically conducted at lower temperatures (100-150° C.) to prevent Ostwald ripening. Overcoating temperature is thought to be size-dependent—larger nanocrystals require higher temperatures than smaller nanocrystals, and nanowires, which are even larger, require even higher temperatures. For instance, a temperature of 215-250° C. may be optimal for the batch syntheses of CdS/CdSe, CdSe/CdS, and CdSe/ZnTe NWs.[1]

In contrast to CdSe/ZnS quantum dot synthesis, longer shell annealing times on the order of minutes or hours were required for successful production of CdSe/ZnS nanowires. Time-consuming ligand exchange steps were eliminated, and were not necessary in order for the nanowires to be coated with a shell. Though dropwise addition is a common method for coating quantum dots in order to prevent self nucleation of shell elements, Examples 1-5 show that nanowire coating was successful under batch injection and flow reaction conditions. While the quantum dot synthesis coating was conducted at 160° C., the nanowire coating step did require higher temperatures above 160° C. (180-190° C.). Surprisingly, while there are reports of nanowire coatings requiring high temperatures under certain conditions [1] this was not necessary under the presented examples and nanowires were successfully coated at temperatures below 200° C.

It should be noted that various changes and modifications to the embodiments described herein will be apparent to those skilled in the art. Such changes and modifications may be made without departing from the spirit and scope of the present invention and without diminishing its attendant advantages. For example, various embodiments of the methods may be provided based on various combinations of the features and functions from the subject matter provided herein.

The following references are not admitted prior art, but can be used to guide one skilled in the art in the practice of the invention and are incorporated herein by reference in their entirety.

[1] Goebl J A, Black R W, Puthussery J, Giblin J, Kosel T H, Kuno M. Solution-based II-VI core/shell nanowire heterostructures. J Am Chem Soc 2008; 130:14822-33.
[2] Wang H, Nakamura H, Uehara M, Yamaguchi Y, Miyazaki M, Maeda H. Highly Luminescent CdSe/ZnS Nanocrystals Synthesized Using a Single-Molecular ZnS Source in a Microfluidic Reactor. Adv Funct Mater 2005; 15:603-8.
[3] Yang H, Luan W, Wan Z, Tu S, Yuan W-K, Wang Z M. Continuous Synthesis of Full-Color Emitting Core/Shell Quantum Dots via Microreaction. Cryst Growth Des 2009; 9:4807-13.
[4] Cao Y W, Banin U. Synthesis and characterization of InAs/InP and InAs/CdSe core/shell nanocrystals. Angew Chemie—Int Ed 1999; 38:3692-4.
[5] Fukata N, Mitome M, Sekiguchi T, Bando Y, Kirkham M, Hong J Il, et al. Characterization of impurity doping and stress in Si/Ge and Ge/Si core-shell nanowires. ACS Nano 2012; 6:8887-95.
[6] Hu Y, Kuemmeth F, Lieber C M, Marcus C M. Hole spin relaxation in Ge-Si core-shell nanowire qubits. Nat Nanotechnol 2011; 7:47-50.
[7] Invitrogen. Qdot® Nanocrystal Technology Overview. QDot Technol Overy n.d.
[8] Mokari T, Banin U. Synthesis and Properties of CdSe/ZnS Core/Shell Nanorods. Chem Mater 2003; 15:3955-60.
[9] Li Z, Ma X, Sun Q, Wang Z, Liu J, Zhu Z, et al. Synthesis and Characterization of Colloidal Core-Shell Semiconductor Nanowires. Eur J Inorg Chem 2010; 2010:4325-31.
[10] Fan Z, Razavi H, Do J, Moriwaki A, Ergen O, Chueh Y-L, et al. Three-dimensional nanopillar-array photovoltaics on low-cost and flexible substrates. Nat Mater 2009; 8:648-53.
[11] Tang J, Huo Z, Brittman S, Gao H, Yang P. Solution-processed core-shell nanowires for efficient photovoltaic cells. Nat Nanotechnol 2011; 6:568-72.
[12] Tian B, Zheng X, Kempa T J, Fang Y, Yu N, Yu G, et al. Coaxial silicon nanowires as solar cells and nanoelectronic power sources. Nature 2007; 449:885-9.
[13] Tak Y, Hong S J, Lee J S, Yong K. Fabrication of ZnO/CdS core/shell nanowire arrays for efficient solar energy conversion. J Mater Chem 2009; 19:5945.
[14] Singh N, Ponzoni A, Gupta R K, Lee P S, Comini E. Synthesis of In2O3-ZnO core-shell nanowires and their application in gas sensing. Sensors Actuators B Chem 2011; 160:1346-51.
[15] Li C, Su Y, Lv X, Zuo Y, Yang X, Wang Y. Au@Pd core-shell nanoparticles: A highly active electrocatalyst for amperometric gaseous ethanol sensors. Sensors Actuators B Chem 2012; 171-172:1192-8.
[16] Du N, Zhang H, Chen B, Wu J, Yang D. Low-temperature chemical solution route for ZnO based sulfide coaxial nanocables: general synthesis and gas sensor application. Nanotechnology 2007; 18:115619.
[17] Kazes B M, Lewis D Y, Ebenstein Y, Mokari T, Banin U. Lasing from Semiconductor Quantum Rods in a Cylindrical Microcavity ** 2002; 90:317-21.
[18] Yin Y, Jin Z, Hou F. Enhanced solar water-splitting efficiency using core/sheath heterostructure CdS/TiO2 nanotube arrays. Nanotechnology 2007; 18:495608.
[19] Malik M A, O'Brien P, Revaprasadu N, Brien P O. A Simple Route to the Synthesis of Core/Shell Nanoparticles of Chalcogenides. Chem Mater 2002; 14:2004-10.
[20] Wan Z, Luan W, Tu S. Size Controlled Synthesis of Blue Emitting Core/Shell Nanocrystals via Microreaction. J Phys Chem C 2011; 115:1569-75.
[21] Dabbousi B O, Mikulec F V., Heine J R, Mattoussi H, Ober R, Jensen K F, et al. (CdSe) ZnS Core-Shell Quantum Dots: Synthesis and Characterization of a Size Series of Highly Luminescent Nanocrystallites. J Phys Chem B 1997; 101:9463-75.
[22] Thibert A, Frame F A, Busby E, Holmes M A, Osterloh F E, Larsen D S. Sequestering High-Energy Electrons to Facilitate Photocatalytic Hydrogen Generation in CdSe/CdS Nanocrystals. J Phys Chem Lett 2011; 2:2688-94.
[23] Petchsang N, Shapoval L, Vietmeyer F, Yu Y, Hodak J H, Tang I-M, et al. Low temperature solution-phase growth of ZnSe and ZnSe/CdSe core/shell nanowires. Nanoscale 2011; 3:3145-51.
[24] Mokari T, Zhang M, Yang P. Synthesis of Pb Alloy and Core/Shell Nanowires. US 20110268968 A1, 2011.
[25] Liu Y-H, Wang F, Hoy J, Wayman V L, Steinberg L K, Loomis R A, et al. Bright core-shell semiconductor quantum wires. J Am Chem Soc 2012; 134:18797-803.
[26] Mokari T, Habas S E, Zhang M, Yang P. Synthesis of Lead Chalcogenide Alloy and Core-Shell Nanowires. Angew Chemie Int Ed 2008; 47:5605-8.
[27] Tongying P, Plashnitsa V V, Petchsang N, Vietmeyer F, Ferraudi G J, Krylova G, et al. Photocatalytic Hydrogen Generation Efficiencies in One-Dimensional CdSe Heterostructures. J Phys Chem Lett 2012; 3:3234-40.
[28] Zhuang X, Ning C Z, Pan A. Composition and bandgap-graded semiconductor alloy nanowires. Adv Mater 2012; 24:13-33.
[29] Li Z, Kurtulus O, Fu N, Wang Z, Kornowski A, Pietsch U, et al. Controlled Synthesis of CdSe Nanowires by Solution-Liquid-Solid Method. Adv Funct Mater 2009; 19:3650-61.
[30] Wang F, Dong A, Sun J, Tang R, Yu H, Buhro W E. Solution-liquid-solid growth of semiconductor nanowires. Inorg Chem 2006; 45:7511-21.
[31] Kuno M. An overview of solution-based semiconductor nanowires: synthesis and optical studies. Phys Chem Chem Phys 2008; 10:620.
[32] Zhuang Z, Peng Q, Li Y. Controlled synthesis of semiconductor nanostructures in the liquid phase. Chem Soc Rev 2011; 40:5492.
[33] Li J J, Wang Y A, Guo W, Keay J C, Mishima T D, Johnson M B, et al. Large-scale synthesis of nearly monodisperse CdSe/CdS core/shell nanocrystals using air-stable reagents via successive ion layer adsorption and reaction. J Am Chem Soc 2003; 125:12567-75.
[34] Talapin D V., Rogach A L, Kornowski A, Haase M, Weller H. Highly Luminescent Monodisperse CdSe and CdSe/ZnS Nanocrystals Synthesized in a Hexadecylamine-Trioctylphosphine Oxide-Trioctylphospine Mixture. Nano Lett 2001; 1:207-11.
[35] Murray C, Norris D, Bawendi M G. Synthesis and characterization of nearly monodisperse CdE (E=S, Se, Te) semiconductor nanocrystallites. J Am Chem Soc 1993; 115:8706-15.

[36] Pradhan N, Katz B, Efrima S. Synthesis of High-Quality Metal Sulfide Nanoparticles from Alkyl Xanthate Single Precursors in Alkylamine Solvents. J Phys Chem B 2003; 107:13843-54.

[37] Aldana J, Wang Y A, Peng X. Photochemical instability of CdSe nanocrystals coated by hydrophilic thiols. J Am Chem Soc 2001; 123:8844-50.

[38] Lim S J, Kim W, Jung S, Seo J, Shin S K. Anisotropic Etching of Semiconductor Nanocrystals. Chem Mater 2011; 23:5029-36.

[39] Li R, Lee J, Yang B, Horspool D N, Aindow M, Papadimitrakopoulos F. Amine-assisted facetted etching of CdSe nanocrystals. J Am Chem Soc 2005; 127:2524-32.

[40] Wang F, Tang R, Kao J L-FL-F, Dingman S D, Buhro W E. Spectroscopic Identification of Tri-n-octylphosphine Oxide (TOPO) Impurities and Elucidation of Their Roles in Cadmium Selenide Quantum-Wire Growth. J Am Chem Soc 2009; 131:4983-94.

[41] Bullen C R, van Embden J, Jasieniak J, Cosgriff J E, Mulder R J, Rizzardo E, et al. High Activity Phosphine-Free Selenium Precursor Solution for Semiconductor Nanocrystal Growth. Chem Mater 2010; 22:4135-43.

We claim:

1. A coated nanowire comprising:
    a nanowire body comprising a cadmium semiconductive material, wherein the nanowire body includes an outer surface, the nanowire body having a length of 1 μm to 40 μM, a diameter of 1 nm to 100 nm, and an aspect ratio of 10:1 to 1000:1; and
    a semiconductive coating on at least a portion of the outer surface of the nanowire body, wherein the semiconductive coating includes zinc;
    wherein the coated nanowire has a length of 1 μm to 40 μm and diameter of 1 nm to 100 nm.

2. The coated nanowire of claim 1 wherein the semiconductive coating includes sulfur.

3. The coated nanowire of claim 1 wherein the nanowire body includes a cadmium selenide semiconductive material.

4. The coated nanowire of claim 1 wherein the nanowire body includes CdSe and the semiconductive coating includes ZnS.

5. A continuous flow method of manufacturing coated nanowires, wherein the method comprises:
    providing a nanowire solution including a plurality of nanowires, the nanowires having a length of 1 μM to 40 μm, a diameter of 1 nm to 100 nm, and an aspect ratio of 10:1 to 1000:1;
    combining the nanowire solution and a shell precursor solution in a second continuous flow reactor to form a combined solution;
    wherein the second continuous flow reactor is maintained at a temperature between, and including, 90° C. to 250° C.; and
    annealing the shell precursor solution to an outer surface of the nanowires to form coated nanowires having a length of 1 μm to 40 μm and diameter of 1 nm to 100 nm.

6. The method of claim 5 wherein the shell precursor solution comprises zinc diethyldithiocarbamate as a single source of zinc and sulfur.

7. The method of claim 5 wherein the shell precursor solution comprises a cadmium alkyl xanthate as a single source of cadmium and sulfur.

8. The method of claim 5 further comprising:
    combining a metal precursor solution, an anion precursor solution and a catalyst precursor solution in a first continuous flow reactor to create the plurality of nanowires, wherein the first continuous flow reactor is maintained at a temperature between, and including, 170° C. to 300° C.,
    wherein the first continuous flow reactor is in communication with the second continuous flow reactor.

9. The method of claim 8 wherein the metal precursor solution includes cadmium oxide.

10. The method of claim 8 wherein the metal precursor solution includes cadmium oxide, a fatty acid, and trioctylphosphine oxide.

11. The method of claim 8 wherein at least one of the metal precursor solution and the anion precursor solution includes the catalyst precursor solution, wherein the catalyst precursor solution includes a bismuth compound.

12. The method of claim 8 wherein the plurality of nanowires include CdSe nanowires.

13. A method of producing nanowires, the method comprising:
    combining a cadmium precursor solution, a selenium precursor solution, and a catalyst solution at a temperature between, and including 200° C. to 300° C., to create a solution including a plurality of CdSe nanowires, the nanowires having a length of 1 μm to 40 μm, a diameter of 1 nm to 100 nm, and an aspect ratio of 10:1 to 1000:1,
    wherein the cadmium precursor solution includes cadmium oxide, trioctylphosphine oxide, octadecene, and diphenyl ether,
    wherein the selenium precursor solution includes selenium-octadecene (Se-ODE), wherein the catalyst solution includes a bismuth compound,
    combining the plurality of nanowires and a shell precursor solution at a temperature between, and including, 90° C. to 250° C. to form a combined solution; and
    annealing the shell precursor solution to the nanowires to form a plurality of coated CdSe nanowires having a length of 1 μm to 40 μm and diameter of 1 nm to 100 nm.

14. The method of claim 13 wherein the shell precursor solution is annealed between, and including, 10 minutes to 24 hours.

15. The method of claim 13 wherein the shell precursor solution includes at least one of octadecene, diphenyl ether, dimethyl formamide, and trioctylphosphine.

16. The method of claim 13 wherein the solution including the plurality of nanowires includes oleylamine, oleic acid, and trioctylphosphine.

17. The method of claim 13 wherein the shell precursor solution includes a cadmium alkyl xanthate.

18. The method of claim 13 wherein the shell precursor solution includes a cadmium alkyl xanthate and at least one of octadecene, diphenyl ether, dimethyl formamide, and trioctylphosphine.

19. The coated nanowire of claim 1 wherein the semiconductive coating has a morphology selected from the range of smooth to rough to spiky.

20. The coated nanowire of claim 1 wherein the semiconductive coating has a spiky morphology.

21. The method of claim 5, without a step of pretreating the nanowires by a ligand exchange process.

22. The method of claim 13 wherein the bismuth compound comprises bismuth chloride.

23. The method of claim 22 wherein the semiconductive coating has a spiky texture.

24. The method of claim 13, without a step of pretreating the nanowires by a ligand exchange process.

25. The method of claim 13, wherein the step of combining the nanowires and the shell precursor solution and the step of annealing the shell precursor solution to the nanowires are conducted in a single step.

* * * * *